US00RE43940E

(19) United States
(12) Reissued Patent
Tuttle et al.

(10) Patent Number: US RE43,940 E
(45) Date of Reissued Patent: Jan. 22, 2013

(54) METHOD AND APPARATUS FOR RFID COMMUNICATION

(75) Inventors: Mark E. Tuttle, Boise, ID (US); Rickie C. Lake, Meridian, ID (US); Steven F. Schicht, Austin, TX (US); John R. Tuttle, Longmont, CO (US)

(73) Assignee: Round Rock Research, LLC, Mt. Kisco, NY (US)

(21) Appl. No.: 11/864,715

(22) Filed: Sep. 28, 2007

Related U.S. Patent Documents

Reissue of:
(64) Patent No.: 6,487,681
Issued: Nov. 26, 2002
Appl. No.: 09/437,718
Filed: Nov. 9, 1999

U.S. Applications:
(63) Continuation of application No. 10/997,556, filed on Nov. 24, 2004, which is a continuation of application No. 08/306,906, filed on Sep. 15, 1994, now Pat. No. 5,983,363, which is a continuation-in-part of application No. 07/979,607, filed on Nov. 20, 1992, now Pat. No. 6,058,497.

(51) Int. Cl.
*G06F 11/00* (2006.01)
(52) U.S. Cl. ..... 714/25; 324/605; 324/613
(58) Field of Classification Search ..... None
See application file for complete search history.

(56) References Cited

U.S. PATENT DOCUMENTS

| | | | | |
|---|---|---|---|---|
| 3,679,874 | A | 7/1972 | Fickenscher | |
| 3,689,885 | A * | 9/1972 | Kaplan et al. | 340/10.1 |
| 3,713,148 | A * | 1/1973 | Cardullo et al. | 342/42 |
| 3,754,170 | A * | 8/1973 | Tsuda et al. | 257/659 |
| 4,384,288 | A * | 5/1983 | Walton | 340/5.8 |
| 4,704,614 | A * | 11/1987 | Poirier et al. | 343/703 |
| 4,704,734 | A * | 11/1987 | Menich et al. | 455/440 |
| 4,750,197 | A | 6/1988 | Denekamp et al. | |
| 4,761,778 | A | 8/1988 | Hui | |
| 4,776,464 | A | 10/1988 | Miller et al. | |
| 4,850,009 | A | 7/1989 | Zook et al. | |
| 4,860,602 | A * | 8/1989 | Hines et al. | 73/865.9 |
| 4,930,129 | A * | 5/1990 | Takahira | 714/766 |
| 4,962,485 | A * | 10/1990 | Kato et al. | 365/229 |
| 4,996,715 | A * | 2/1991 | Marui et al. | 455/421 |
| 4,999,636 | A | 3/1991 | Landt et al. | |
| 5,008,661 | A | 4/1991 | Raj | |
| 5,068,521 | A * | 11/1991 | Yamaguchi | 235/492 |
| 5,087,920 | A * | 2/1992 | Tsurumaru et al. | 343/700 MS |
| 5,113,184 | A * | 5/1992 | Katayama | 340/10.51 |
| 5,121,407 | A | 6/1992 | Partyka et al. | |
| 5,148,103 | A * | 9/1992 | Pasiecznik, Jr. | 324/754.08 |
| 5,148,618 | A | 9/1992 | Brewster | |

(Continued)

OTHER PUBLICATIONS

USPTO Transaction History of related U.S. Appl. No. 07/979,607, filed Nov. 20, 1992, entitled "Testing And Burn-In Of IC Chips Using Radio Frequency Transmission," now U.S. Patent No. 6,058,497.

(Continued)

*Primary Examiner* — Gabriel Chu
(74) *Attorney, Agent, or Firm* — Lerner, David, Littenberg, Krumholz & Mentlik, LLP

(57) ABSTRACT

[A plurality of battery-operated transceivers encapsulated by lamination to form a sheet of independent transceivers is tested in a two piece fixture that forms an enclosure surrounding each in-sheet transceiver. Each enclosure has an antenna for transmitting a command signal to the transceiver at a known power level and for receiving a reply message from the transceiver containing a power level measurement made by the transceiver. Test methods using the fixture of the present invention are also described.] *An RFID tag and interrogator may each include a transmitter and a receiver. The tag and interrogator may communicate with each other at different frequency bands and may communicate in accordance with a wireless communication protocol.*

9 Claims, 3 Drawing Sheets

U.S. PATENT DOCUMENTS

| | | | | | |
|---|---|---|---|---|---|
| 5,149,662 | A | * | 9/1992 | Eichelberger | 438/15 |
| 5,150,114 | A | | 9/1992 | Johansson | |
| 5,153,524 | A | * | 10/1992 | McCormack | 324/627 |
| 5,182,442 | A | * | 1/1993 | Takahira | 235/492 |
| 5,198,647 | A | * | 3/1993 | Mizuta | 235/449 |
| 5,202,838 | A | * | 4/1993 | Inoue | 702/57 |
| 5,212,373 | A | * | 5/1993 | Fujioka et al. | 235/492 |
| 5,220,158 | A | * | 6/1993 | Takahira et al. | 235/492 |
| 5,226,167 | A | * | 7/1993 | Yamaguchi | 332/107 |
| 5,247,577 | A | * | 9/1993 | Bailey et al. | 713/191 |
| 5,252,914 | A | * | 10/1993 | Bobbitt et al. | 324/759.03 |
| 5,274,221 | A | * | 12/1993 | Matsubara | 235/492 |
| 5,278,571 | A | * | 1/1994 | Helfrick | 343/703 |
| 5,279,975 | A | * | 1/1994 | Devereaux et al. | 438/18 |
| 5,315,241 | A | * | 5/1994 | Ewers | 438/15 |
| 5,340,968 | A | * | 8/1994 | Watanabe et al. | 235/380 |
| 5,343,478 | A | * | 8/1994 | James et al. | 714/726 |
| 5,347,274 | A | | 9/1994 | Hassett | |
| 5,349,139 | A | * | 9/1994 | Verrier et al. | 178/19.04 |
| 5,365,551 | A | * | 11/1994 | Snodgrass et al. | 375/141 |
| 5,373,503 | A | | 12/1994 | Chen | |
| 5,434,394 | A | * | 7/1995 | Roach et al. | 235/375 |
| 5,448,110 | A | * | 9/1995 | Tuttle et al. | 257/723 |
| 5,455,575 | A | * | 10/1995 | Schuermann | 342/42 |
| 5,521,600 | A | | 5/1996 | McEwan | |
| 5,560,970 | A | | 10/1996 | Ludeb uhl | |
| 5,583,850 | A | | 12/1996 | Snodgrass | |
| 5,671,362 | A | | 9/1997 | Cowe et al. | |
| 5,751,227 | A | | 5/1998 | Yoshida et al. | |
| 5,751,256 | A | | 5/1998 | McDonough et al. | |
| 5,764,655 | A | * | 6/1998 | Kirihata et al. | 714/733 |
| 5,776,278 | A | * | 7/1998 | Tuttle et al. | 156/213 |
| 5,785,181 | A | | 7/1998 | Quartararo, Jr. | |
| 5,798,693 | A | | 8/1998 | Engellenner | |
| 5,828,693 | A | | 10/1998 | Mays et al. | |
| 5,841,770 | A | | 11/1998 | Snodgrass | |
| 5,855,988 | A | | 1/1999 | Matsuo | |
| 5,887,176 | A | | 3/1999 | Griffith et al. | |
| 5,920,287 | A | | 7/1999 | Belcher et al. | |
| 5,983,363 | A | * | 11/1999 | Tuttle et al. | 714/25 |
| 6,045,652 | A | * | 4/2000 | Tuttle et al. | 156/292 |
| 6,058,497 | A | * | 5/2000 | Tuttle | 714/733 |
| 6,121,544 | A | | 9/2000 | Petsinger | |
| 6,144,301 | A | | 11/2000 | Frieden | |
| 6,161,205 | A | * | 12/2000 | Tuttle | 714/724 |
| 6,538,564 | B1 | | 3/2003 | Cole | |
| 7,158,031 | B2 | * | 1/2007 | Tuttle | 340/572.1 |
| 7,163,152 | B2 | | 1/2007 | Osborn et al. | |
| 7,175,084 | B2 | | 2/2007 | Mennecart et al. | |
| 7,482,925 | B2 | | 1/2009 | Hammad et al. | |
| 2001/0007335 | A1 | * | 7/2001 | Tuttle et al. | 235/492 |
| 2006/0187061 | A1 | | 8/2006 | Colby | |

OTHER PUBLICATIONS

USPTO Transaction History of related U.S. Appl. No. 08/306,906, filed Sep. 15, 1994, entitled "In-Sheet Transceiver Testing," now U.S. Patent No. 5,983,363.

USPTO Transaction History of related U.S. Appl. No. 09/193,002, filed Nov. 16, 1998, entitled "Testing And Burn-In Of IC Chips Using Radio Frequency Transmission," now U.S. Patent No. 6,161,205.

USPTO Transaction History of related U.S. Appl. No. 09/437,718, filed Nov. 9, 1999, entitled "In-Sheet Teanseciever Testing," now U.S. Patent No. 6,487,681.

USPTO Transaction History of related U.S. Appl. No. 09/675,452, filed Sep. 28, 2000, entitled "Testing and Burn-In of IC Chips Using Radio Frequency Transmission," now U.S. Patent No. 6,357,025.

USPTO Transaction History of related U.S. Appl. No. 10/997,556, filed Nov. 24, 2004, entitled "Method and Apparatus for RFID Label Handling."

USPTO Transaction History of related U.S. Appl. No. 11/864,708, filed Sep. 28, 2007, entitled "Method and Apparatus for RFID Communication."

USPTO Transaction History of related U.S. Appl. No. 11/864,710, filed Sep. 28, 2007, entitled "Method and Apparatus for RFID Communication."

USPTO Transaction History of related U.S. Appl. No. 11/864,718, filed Sep. 28, 2007, entitled "Method and Apparatus for RFID Communication."

USPTO Transaction History of related U.S. Appl. No. 11/864,723, filed Sep. 28, 2007, entitled "Method and Apparatus for RFID Communication."

* cited by examiner

METHOD AND APPARATUS FOR RFID COMMUNICATION

Matter enclosed in heavy brackets [ ] appears in the original patent but forms no part of this reissue specification; matter printed in italics indicates the additions made by reissue.

*RELATED REISSUE APPLICATIONS*

*More than one reissue application has been filed for the reissue of U.S. Pat. No. 6,487,681. The reissue applications are the initial reissue application Ser. No. 10/997,556 filed Nov. 24, 2004, a continuation reissue application Ser. No. 11/864,708 filed Sep. 28, 2007, a continuation reissue application Ser. No. 11/864,710 filed Sep. 28, 2007, a continuation reissue application Ser. No. 11/864,715 filed Sep. 28, 2007, another continuation reissue application Ser. No. 11/864,723 filed Sep. 28, 2007 and the present continuation reissue application.*

CROSS REFERENCE TO RELATED APPLICATIONS

This application *is* a *continuation of a reissue application Ser. No. 10/997,556, filed Nov. 24, 2004, which is a reissue application of U.S. patent application Ser. No. 09/437,718, now U.S. Pat. No. 6,487,681, which is a* continuation of application Ser. No. 08/306,906 filed Sep. 15, 1994, now U.S. Pat. No. 5,983,363, which is a continuation in part of and claims priority from U.S. patent application Ser. No. 07/979,607 filed Nov. 20, 1992, now U.S. Pat. No. 6,058,497, *and the teachings of all of which are incorporated by reference herein.*

FIELD OF THE INVENTION

This invention relates to transponder testing and to test systems, fixtures, and methods for testing transponders.

BACKGROUND OF THE INVENTION

As an introduction to the problems solved by the present invention, consider the conventional transponder used for radio frequency identification (RFID). Such a transponder includes a radio transceiver with a built-in antenna for receiving command message signals and for transmitting reply message signals. Inexpensive transponders find application in systems for tracking material, personnel, and animals, inventory management, baggage handling, and the mail to name a few major areas.

A transponder necessarily includes a transceiver. Such transponders may include an integrated circuit transceiver, a battery, and a printed circuit antenna hermetically encapsulated in a laminated package about 1 inch square and approximately as thick as a mailing label or tag. In such a laminated package, manufacturing acceptance tests on each unit become difficult and costly.

Conventional transponders are inexpensively manufactured in sheets having for example 250 integrated circuit transceivers spaced apart in a row and column array between polymer films. Prior to use, the transponders are separated from each other by shearing the sheet between adjacent rows and columns. Conventional testing methods and apparatus cannot be used until the transponders are separated from each other.

Conventional manufacturing acceptance tests for transponders are based in part on antenna performance tests that simulate the application in which the transponder will be used. These so called "far-field" tests require a large anechoic chamber and individual testing of a single transponder at a time. Such far-field testing adds significantly to the per unit cost of inexpensive transponders.

Without inexpensive transponder testing for manufacturing acceptance tests, incomplete testing may perpetrate unreliable tracking, inventory, and handling systems, increase the cost of maintaining such systems, and discourage further development and popular acceptance of transponder technology.

In view of the problems described above and related problems that consequently become apparent to those skilled in the applicable arts, the need remains in transponder testing for more accurate and less costly test systems, fixtures, and test methods.

SUMMARY OF THE INVENTION

Accordingly, a test system in one embodiment of the present invention includes a fixture, an interrogator, and a switch cooperating for testing a sheet containing a plurality of transceivers, each transceiver within a contour on the sheet. The fixture, in one embodiment, admits a sheet of transceivers and surrounds each transceiver at its contour so that each transceiver is respectively enclosed within an enclosure. Within each enclosure is an antenna for so called "near-field" communication. The interrogator determines a command signal and evaluates reply signals from each transceiver. The switch is coupled in series between each antenna and the interrogator for selecting an antenna for transmitting the command signal and for receiving the reply signal.

According to a first aspect of such an embodiment, the fixture isolates transceivers from each other so that multiple transceivers are tested simultaneously. By isolating each transceiver, interference from adjacent transceivers is minimized, transponder identity and location are not confused, and test transmissions are prevented from affecting external equipment including other test stations.

According to another aspect, testing is facilitated by isolating each transceiver at its contour.

According to another aspect, multiple transceivers are moved as a sheet and tested without further handling so that rapid testing is feasible and delays for physical alignment of the transceivers within the fixture is minimized.

According to another aspect, near-field testing is used to eliminate the need for large chambers.

According to another aspect of such a test system, the transfer function of the antenna and detector portion of a transceiver receiver is tested.

The present invention is practiced according to a method in one embodiment which includes the steps of providing an enclosure that admits a sheet of transceivers, each transceiver formed within a respective region of the sheet, closing the enclosure to form an RF seal about each respective region, and operating each transceiver for receiving and transmitting signals.

According to a first aspect of such a method, independent testing of individual transceivers is accomplished for in-sheet transceivers and multiple transceivers are tested simultaneously.

According to another aspect, far-field tests are used to confirm the test signal used in manufacturing tests.

A method, in an alternate embodiment, for testing battery-operated transceivers includes the step of transmitting a wake up signal to a transceiver. According to a first aspect of such a method, only transceivers under test are made operational so that battery power is conserved in other transceivers.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

*An RFID tag and interrogator may each include a transmitter and a receiver. The tag and interrogator may communicate with each other at different frequency bands and may communicate in accordance with a wireless communication protocol.*

A person having ordinary skill in the art will recognize where portions of a diagram have been expanded to improve the clarity of the presentation.

In each functional block diagram, a broad arrow symbolically represents a group of signals that together signify a binary code. For example, a group of bus lines is represented by a broad arrow because a binary value conveyed by the bus is signified by the signals on the several bus lines taken together at an instant in time. A group of signals having no binary coded relationship is shown as a single line with an arrow. A single line between functional blocks represents one or more signals.

DETAILED DESCRIPTION OF THE INVENTION

Figure 1:
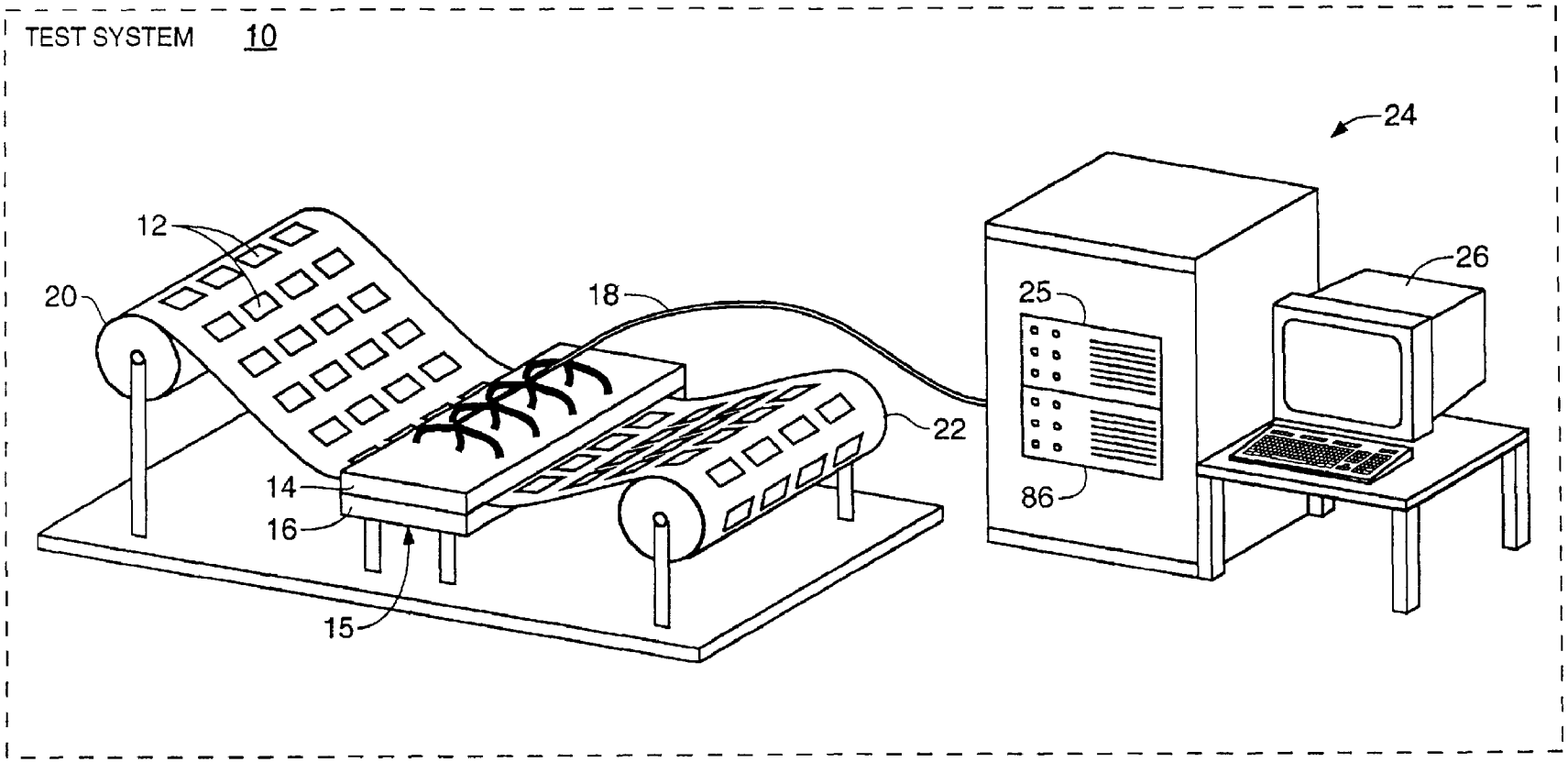
FIG. 1 is a plan view of a test system of the present invention.

FIG. 1 is a plan view of a test system of the present invention. Test system 10 provides manufacturing acceptance tests for an in-sheet transponder 12 provided on continuous roll 20 of laminated films. Transponders under test are located in fixture 15. Tested transponders are received on roll 22. Fixture 15 is connected by cable 18 to subsystem 24 so that signals generated by instrumentation in subsystem 24 are coupled to fixture 15 and so that signals received in fixture 15 are coupled to instruments in subsystem 24 for analysis. Subsystem 24 includes interrogator 25 and computer 86, cooperating for signal generation and analysis. Fixture 15 is characterized, according to a method of the present invention, using a correlation to far-field testing. Characterization of a system, fixture, or circuit conventionally includes making measurements of characteristic features of its structure and operation.

Transponders to be tested in an alternate embodiment are provided to fixture 15 in separated sheets, each sheet having an array of rows and columns of transponders. For example in one embodiment, about 250 transponders are manufactured in a sheet measuring about 18 inches by about 24 inches.

Test system 10 also includes materials handling equipment, not shown, for supplying sheets or rolls of transponders for testing, for aligning transponders within fixture 15, and for receiving tested transponders for further manufacturing steps. In one embodiment, individual tested transponders are separated (singulated) from the sheet in which testing occurred and are provided on an adhesive backing for distribution as tape-and-reel components or ready-to-use articles such as baggage tags, inventory labels, or badges, to name a few feasible applications.

Roll 20 includes a plurality of identical transponders, such as transponder 12. Transponder 12 is a radio frequency identification (RFID) device of the type described in U.S. patent application Ser. No. 07/990,918 by Snodgrass et al. filed Dec. 15, 1992, incorporated herein by reference. In one embodiment, transponder 12 is about 1 inch square, includes a lithium battery, an integrated circuit transceiver, and an antenna packaged using thin film and lamination techniques.

Figure 2:
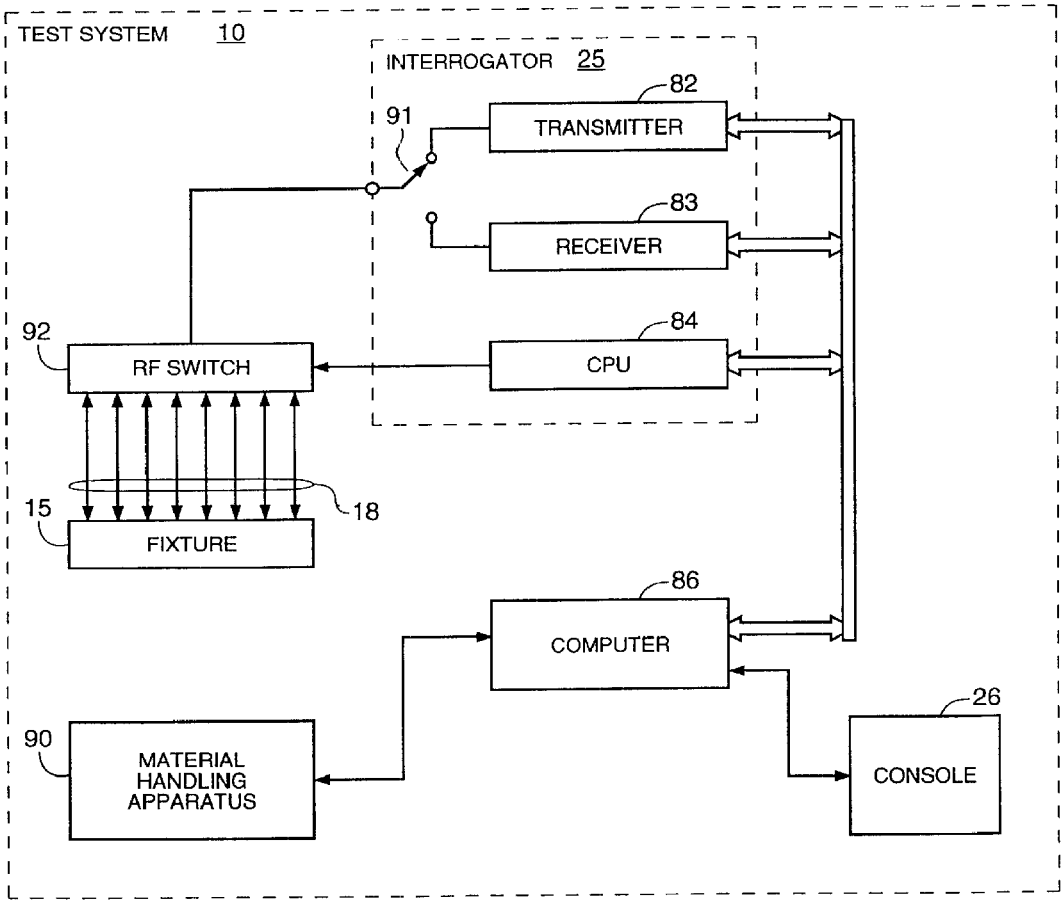
FIG. 2 is a functional block diagram of the test system of FIG. 1.

FIG. 2 is a functional block diagram of a test system of the present invention. Test system 10 includes six major functional elements: operator console 26, test system computer 86, interrogator 25, radio frequency (RF) switch 92, fixture 15, and material handling apparatus 90.

In operation, test system computer 86 directs material handling apparatus 90 to align a sheet of transponders (not shown) within fixture 15. Alignment assures that each transponder is isolated from other transponders in a manner to be discussed with reference to FIG. 4. In one embodiment, alignment includes automatic recognition by video camera of guide marks on the sheet and control of stepper motors according to software performed by computer 86 or in an alternate embodiment by a computer in material handling apparatus 90. One of ordinary skill will recognize that alignment includes the location of the fixture relative to the sheet so that the fixture, the sheet, or both can be repositioned to accomplish proper alignment.

When a sheet of transponders is aligned, computer 86 directs RF switch 92 for independently testing individual transponders. In a first embodiment, one transponder is tested at a time. In an alternate embodiment, multiple interrogators are coordinated to test multiple transponders simultaneously. Independent transponder operation during simultaneous testing of multiple transponders is accomplished in part by isolation provided by fixture 15.

During tests of each transponder, computer 86 directs interrogator 25, particularly interrogator central processing unit (CPU) 84, to generate and transmit via transmitter 82 command messages through switches 91 and 92, and to receive and interpret reply messages generated by that transponder that are conveyed through RF switch 92 and switch 91 to receiver 83. Interrogator 25 is of the type described in U.S. patent application Ser. No. 07/990,918 by Snodgrass et al. filed Dec. 15, 1992, incorporated herein by reference. Switch 91 and switch 92 are coax switches, common in the RF testing art. In alternate embodiments, switch 91 is eliminated and command and reply messages are separated by communication techniques known in the art, for example separation by time division or use of different frequency bands or different modulation techniques.

In one embodiment of the present invention, a test of the sensitivity of the receiver portion of the transceiver portion of a transponder under test includes transmitting from interrogator 25 a test signal, for example, a command message at a test power level. Transponders that fail to respond by transmitting a proper reply message fail the test at a first point. In another embodiment, the reply message includes a measurement of the signal strength seen by the receiver portion of the transponder under test. Transponders that report measurements of received signal strength that do not exceed an expected signal strength fail the test at a second point. By setting both test points as requirements, the population of tested transponders is of higher quality because marginal units are rejected. Therefore, the determination of the test power level and the expected signal strength are important to production and application economics.

Fixture 15 surrounds each transponder so that each transceiver's antenna is within one enclosure. In one embodiment, the enclosure surrounds an entire transponder and a small volume of ambient air so that the enclosure forms a cavity. In an alternate embodiment, only the transceiver's antenna is enclosed. In yet another alternate embodiment, the small volume is filled with potting material so that, for example, the cleanliness of the enclosure and the position of the antenna within the enclosure are maintained. In one embodiment, the potting material includes polyimide. In alternate embodiments, conventional potting materials and conventional materials used for films for encapsulating the transponder are used. The power level to be used for each so enclosure depends on the materials and dimensions of the enclosure and the transponder.

To determine the test power level appropriate for one of several enclosures formed by fixture 15, far-field test results are correlated to conventional characterization tests of the transponder, potting material (if any), and the enclosure. By repeating characterization tests in each enclosure, a so called cavity transfer function relating test power level to received signal strength is determined for each enclosure of fixture 15.

Figure 3:
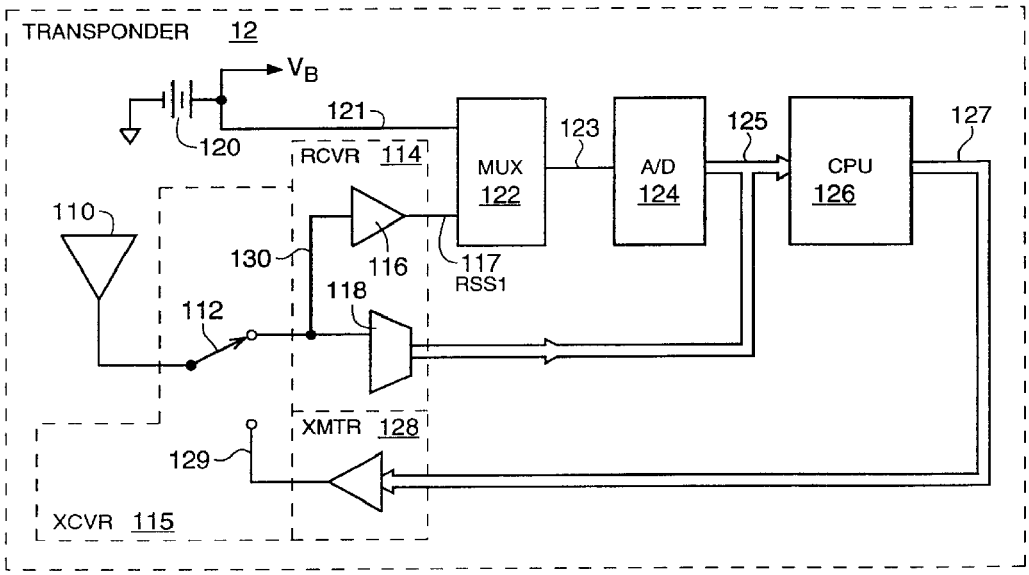
FIG. 3 is a functional block diagram of a transponder of the present invention to be tested in the test system of FIG. 1.

FIG. 3 is a functional block diagram of a transponder of the present invention to be tested in the test system of FIG. 1. Transponder 12 includes battery 120, antenna 110, transceiver 115, multiplexer 122, analog to digital (A/D) converter 124, and central processing unit (CPU) 126. Transceiver 115 includes transmit/receive switch 112, receiver 114, and transmitter 128. Transponder 12 operates from battery power provided by battery 120. All functional blocks are coupled to receive battery power signal VB.

In operation, CPU 126 directs multiplexer 122 to select one of several analog signals for conversion. For example, when a report of battery voltage is desired, line 121 is selected and coupled to A/D converter 124. In response to a signal on line 123, A/D converter 124 provides a digital signal on line 125 to CPU 126. CPU 126 then forms a message signal on line 127 and directs transmission by transmitter 128 through switch 112 and antenna 110.

Except for antenna 110 and battery 120, the circuitry of transponder 12 is conventionally formed as an integrated circuit, manufactured in large number on a wafer. In a preferred test method of the present invention, some manufacturing acceptance tests are conducted after fabrication of a wafer containing perhaps a thousand independent integrated circuits. For example, the conversion accuracy of A/D converter 124 varies from wafer to wafer depending on variations in the fabrication process. Prior to forming dice from the wafer, all or a representative sample of A/D converters, are tested by introducing stimulus signals and obtaining response signals via wafer probes, as is well known in the art. Test results are generalized to determine an A/D transfer function relating signals 123 and 125 for the A/D converters on a particular wafer.

Operation of transponder 12 includes at least two modes of operation. In a first mode, power is conserved by disabling most transponder circuits. When a wake up signal is received by antenna 110, coupled to receiver 114 through switch 112, detected and demodulated by receiver circuit 118, and interpreted by CPU 126 as a proper wake up signal, transponder 12 enters a second mode of operation. In the second mode, power is applied to substantially all transponder circuitry for normal operation. In a preferred embodiment, the test signal is both a wake up signal and a request for a report of received signal strength.

Receiver 114 includes detector 116 for detecting received signal strength. Antenna 110 is coupled through switch 112 to convey an RF signal on line 130 to detector 116. Detector 116 provides on line 117 to multiplexer 122 signal RSS1 proportional to received signal strength. When a report of received signal strength is desired, line 117 is selected and signal RSS1 is coupled to A/D converter 124. In response to a signal on line 123, A/D converter 124 provides a digital signal on line 125 to CPU 126. CPU 126 then forms a message signal on line 127 and directs transmission by transmitter 128 through switch 112 and antenna 110.

Figure 4:
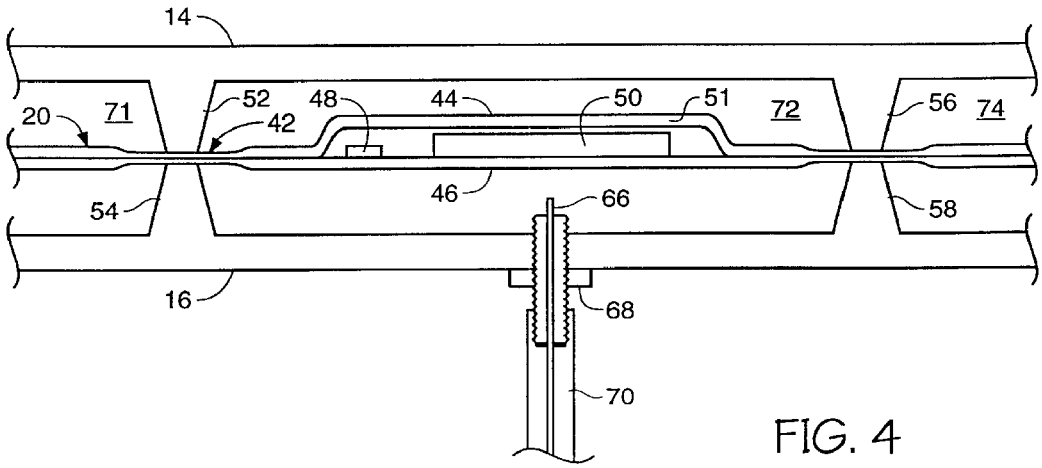
FIG. 4 is a cross sectional view of fixture 15.

FIG. 4 is a cross sectional view of fixture 15. Fixture 15 includes first section 14, second section 16, and an antenna in each enclosure (or cavity). For example, cavities 71, 72 and 74 are shown with antenna 66 in cavity 72. First section 14 includes a matrix of ridges, for example 52 and 56. Second section 16 includes a matching matrix of ridges, for example 54 and 58. Each pair of ridges for example 56 and 58 separates and defines adjacent cavities, for example cavities 72 and 74.

The upper surface of ridges 54 and 58 in second section 16 define a horizontal plane onto which a portion of roll 20 of laminated films is positioned. When that portion includes in-sheet transponders, material handling apparatus position the portion for in-sheet transponder testing. First section 14 and second section 16 are then pressed together against sheet 20 so that each transponder, for example transponder 51, is isolated from each other transponder in sheet 20. Ridges about each cavity form an RF seal.

The RF seal provides isolation. Isolation prevents RF energy radiated from antenna 66 in cavity 72 from interfering with tests conducted in adjacent cavity 74. The RF seal is not perfect and, therefore, isolation is not perfect, due to leakage for example between ridges 52 and 54 and between 56 and 58. Since leakage RF energy must pass through films 44 and 46, conventional shielding in the neighborhood of the contact between adjacent ridges is effective to further reduce leakage and thereby improve isolation. Such shielding includes placement of conductors and conductive materials within, between, and on the surfaces of films 44 and 46.

Isolation is operative to decouple an antenna in one enclosure from an antenna in an adjacent enclosure. From the point of view at antenna 66, when a signal originating in cavity 72 is stronger than a signal originating in cavity 74, for example, the signal sources and their respective antennas are considered decoupled from each other. Decoupling can also be accomplished by improving the gain of cavity 72, for example, by making its dimensions compatible with a wavelength of the signal originating in cavity 72.

In an alternate embodiment, first section 14 and second section 16 are fabricated as flat plates having no ridges 52, 54, 56, or 58. The distance between these plates is smaller than one wavelength of the signal originating in cavity 72 so that adjacent transponder antennas are effectively decoupled for purposes including manufacturing acceptance testing. In such an embodiment, first section 14 and second section 16 sandwich the sheet therebetween.

In a preferred embodiment, each transponder is formed within a square contour and each cavity has a matching square cross section so that transponders are isolated each one at its contour. In this sense, a contour extends through both films 44 and 46 to circumscribe one transponder. In a mathematical sense, a contour is defined on a surface. Since top film 44 has an upper surface, a first contour is defined on that top surface. Since bottom film 46 has a bottom surface, a second contour is defined on that bottom surface. The square cavity formed by ridges 54 and 58 in the second section is circumscribed by a third contour in the plane defined by the tops of the ridges on which the sheet is positioned. Thus, alignment includes positioning the sheet and the fixture so that the third contour formed on ridges 54 and 58 touches the sheet at the second contour on the bottom of film 46. When properly aligned, the first section, having a similar fourth contour on ridges 52 and 56, touches the first contour on the top of film 44. In a preferred embodiment, the first and second contours are directly opposed through the sheet. In alternate embodiments, ridges 52 and 54 touch film 44 along a sloped, concave, notched, or stepped surface for greater isolation. In such embodiments, important contours are not necessarily directly opposed.

Transponder 51 is identical to transponder 12 as previously described. Transponder 51 is of the type described as an enclosed transceiver in U.S. patent application Ser. No. 08/123,030, filed Sep. 14, 1993, incorporated herein by reference. The cross-sectional view of transponder 51 shows integrated circuit 48 and battery 50 between film 44 and film 46. Integrated circuit 48 includes the transceiver circuitry of transponder 51. Battery 50, in one embodiment, includes a metal surface coupled to operate as part of the antenna for the transceiver circuitry. Additional conductive traces on film 44 and film 46 cooperate for coupling battery power to integrated circuit 48 and for operation as part of the antenna for the transceiver. Films 44 and 46 are sealed to each other around a contour that encircles integrated circuit 48 and battery 50. In one embodiment, the seal is made by embossing so that the thickness of films 44 and 46 is reduced as shown at seal 42. After testing, transceiver 51 is separated from the sheet by cutting through films 44 and 46 at a point outside seal 42 so that transceiver 51 remains sealed after testing.

The central internal conductor of coax cable 70 is extended into cavity 72 for operation as a near-field antenna. Feed through fitting 68 holds coax cable 70 onto second section 16, shields the central conductor, and provides continuity of impedance from cable 70 up to antenna 66.

The amount of radiation coupled between antenna 66 and transponder 51 depends in part on several variables including the dimensions of cavity 72, the wavelengths of the radiated signals, potting or other materials (if any) within the enclosure, and the distance between antenna 66 and film 46. Although the location of transponder 51 is controlled by maintaining tension on sheet 20 as first section 14 is pressed against second section 16, these variables are expected to vary to some extent from cavity to cavity, from test to test, and over time with wear and handling of fixture 15 and operation and wear in materials handling apparatus used to position fixture 15, sheet 20, or both.

In a preferred embodiment, antenna 110 of transponder 12 is a square loop antenna for communication at about 2.45 gigahertz. The wavelength at that frequency is about 12.2 centimeters or about 4.82 inches. One of ordinary skill in the art will understand that cavity dimensions discussed above must lie outside the loop antenna. Conventional simulation may be used to arrive at sufficient or optimal dimensions of the cavity and sufficient or optimal dimensional characteristics of the antenna, including its placement and type (dipole, loop, stub, Marconi, etc).

According to a method of the present invention, the magnitude of signal 117 as shown in FIG. 3 is determined so that the effect of variation in the variables discussed above is removed from transponder test results and the pass rate for tested transponders is improved. Such a method begins with a first step of characterizing the encapsulated transponder with far-field tests. Before transponder 51 is tested in fixture 15, the digitization transfer function for analog to digital converter 124 shown in FIG. 3 is determined in a second step. As with the first step, in this second step 1, a desired level of accuracy for manufacturing acceptance tests is achieved using one of several approaches including design simulation, theoretical analysis, tests of a prototype, tests of representative samples, or tests of every transponder. In a preferred embodiment, sufficient accuracy is obtained for a manufacturing lot of transponders by conducting wafer probe tests for the second step.

In a third step, the cavity is characterized by design simulation, theoretical analysis, or conventional tests.

Fourth, a prototype or representative transponder 51 is placed in the cavity shown in FIG. 4 that was characterized in the third step. In a fifth step, a pass/fail test power level and the expected reported signal strength are determined by analysis of the results of tests made with the representative transponder, the characterization data, and the results of simulation and other techniques known in the art. Together the process of determining in this fifth step is defined as correlating far-field measurements with transceiver responses.

After test power level and response data are determined, manufacturing acceptance testing can proceed by replacing the representative transponder with an untested transponder 51. While in the cavity and isolated from other transponders, several tests are performed including a receiver sensitivity test.

A receiver sensitivity test of the present invention includes the following steps: radiating a test signal from antenna 66; converting analog signal RSS1 received by antenna 110 to a digital result on line 125; transmitting, by means of transmitter 128 and antenna 110, a message conveying the digital result; receiving the message via antenna 66; and making a pass/fail determination based on the response (if any) from the untested transponder. As one result, defects in antenna 110, switch 112, and receiver circuit 118 are made apparent.

The foregoing description discusses preferred embodiments of the present invention, which may be changed or modified without departing from the scope of the present invention.

For example, the orientation and shape of fixture 15 as two plates as shown in FIGS. 1 and 4 in alternate and equivalent embodiments are modified for cooperation with material handling apparatus, not shown. In one such modified orientation, the plane at which first section 14 and second section 16 meet is vertical rather than horizontal. In one such modified shape, the fixture has a spherical shape (rather than generally hexahedral), each contour surrounding a transponder is circular (rather than square), and each cavity is spherical (rather than generally hexahedral). In other embodiments, antenna 66 is located in various positions including, for example, in an opposite section of a cavity, within a ridge, in an adjoining cavity not completely isolated by ridges, or (for multiple antennas per cavity) at several of these locations.

Still further, those skilled in the art will understand that first section 14, second section 16, or both in alternate and equivalent embodiments are formed along an axis of turning to permit advancing a portion of sheet 20 as a portion of the fixture turns about its axis. In one embodiment, such movement moves and aligns sheet 20.

In a preferred embodiment, a microwave frequency band is used for transponder communication. The same band is used for transponder testing. In alternate embodiments that a person skilled in the art with knowledge of the teachings of the present invention would recognize as equivalents, another one or more frequency bands are utilized.

As still another example, the complexity of transponder 12 shown in FIG. 3 in alternate embodiments is simplified. Without departing from the scope of the present invention, for example, transmitter 128 is replaced with a transmitter responsive to an analog instead of a digital input, receiver circuit 118 is replaced with a circuit providing an analog rather than a digital output, analog to digital converter 124 is eliminated and CPU 126 is replaced with an analog rather than a digital circuit.

These and other changes and modifications known to those of ordinary skill are intended to be included within the scope of the present invention.

While for the sake of clarity and ease of description, several specific embodiments of the invention have been described; the scope of the invention is intended to be measured by the claims as set forth below. The description is not intended to be exhaustive or to limit the invention to the form disclosed. Other embodiments of the invention will be apparent in light of the disclosure to one of ordinary skill in the art to which the invention applies.

The words and phrases used in the claims are intended to be broadly construed. A "system" refers generally to electrical apparatus and includes but is not limited to rack and panel instrumentation, a packaged integrated circuit, an unpackaged integrated circuit, a combination of packaged or unpackaged integrated circuits or both, a microprocessor, a microcontroller, a memory, a register, a flip-flop, a charge-coupled device, combinations thereof, and equivalents.

A "signal" refers to mechanical and/or electromagnetic energy conveying information. When elements are coupled, a signal is conveyed in any manner feasible with regard to the nature of the coupling. For example, if several electrical conductors couple two elements, then the relevant signal comprises the energy on one, some, or all conductors at a given time or time period. When a physical property of a signal has a quantitative measure and the property is used by design to control or communicate information, then the signal is said to be characterized by having a "magnitude" or "value." The measure may be instantaneous or an average.

*The following disclosure corresponds to the Detailed Description Section and figures of U.S. Pat. No. 5,365,551 (the '551 patent) incorporated by reference above. FIG. 1 of the '551 patent is a functional block diagram of communication system 30 of the present invention as described in the '551 patent. In FIG. 1 of the '551 patent, commander stations 10 and 34 and responder stations 40 and 36 are coupled to common medium 32 by network interfaces 26 and 60, respectively. In practice, a plurality of commander and responder stations would be distributed geographically. The type of medium selected for communication depends on the communication system application; see below for equivalent variations. The embodiment depicted in FIG. 1 of the '551 patent illustrates the invention in an application such as airport baggage handling. For this embodiment, the medium is free space through which radio frequency communication are transmissible.*

*Commander station 10 is designed to achieve a flexible system architecture while incorporating many commercially available components. Commander station 10 includes personal computer system 12 having data and control bus 14 shared by central processor 16, memory 18, and peripheral controllers 20a and 20c. Monitor 22, disk drive 24, and network interface 26 connect to individual peripheral controllers 20a-20c via connecting signals 28a-28c, respectively. Network interface 26 is coupled to common medium 32. Network interface 26 could be implemented in a chassis separate from the chassis of personal computer system 12 or equivalently could be implemented in combination with the functions of the network interface peripheral controller 20c for connection directly to data and control bus 14.*

*The configuration of commander station 10 illustrates several advantages. Communication system configuration and operation are largely dictated by software loaded via disk drive 24, stored in memory 18, and performed by central processor 16. Disk drive 24, memory 18, central processor 16, as well as monitor 22 and peripheral controllers 20a20c are all conventional, general purpose, and readily available apparatus. Therefore, additional functions and changes to communication system 30 can be made in software with little or no mechanical changes to commander station 10. The operation of commander station software will be discussed below.*

*Responder station 40 is designed for minimal circuitry to achieve, among other things, small size and low power consumption. Small size permits convenient use, for example, as a baggage tag. Low power consumption permits further size reduction and reduces manufacturing and operating costs. Small size and low manufacturing costs combine to permit implementing responder station 40 as a convenient. dispensable, throwaway item such as a baggage tag, package label, or the like.*

*In essence, microsequencer 42 forms the core of responder station 40. Microsequencer 42 is a read only memory that produces data signal 48 in response to address signal 44. In operation, a value is presented as address signal 44 once every period of clock signal 46. Data signal 48 from microsequencer 42 is stored in state register 50 once every period of clock signal 46. The output of state register 50 is state signal 52, which forms control bus 54. Control bus 54 causes register transfer operations to be described below. A portion of state signal 52 defines a portion of address signal 44. Thus, a sequence of state transitions occurs in synchronism with clock signal 46 as defined by the internal operation of microsequencer 42 and other signals together comprising address signal 44, as will be described below. A state transition diagram is also discussed below. In the typical microsequencer, internal multiplexers reduce the range of read only memory addresses that would otherwise be required. Microsequencer 42 is of a class of devices described by Charles Belove in "Handbook of Modern Electronics and Electrical Engineering," pp 2135-2142, published by John Wiley & Sons, New York, N.Y. (1986), incorporated herein by reference; and by Y. Chu in "Computer Organization and Microprogramming," published by Prentice-Hall, Englewood Cliffs, N.J. (1972) incorporated in full herein by reference.*

*Network interface 60 of responder station 40 is coupled to common medium 32 in a way similar to the coupling of network interface 26 of commander station 10 to common medium 32. Network interface 60 connects to state register 50 to supply clock signal 46. Network interface 60 connects to control bus 54 so that send and receive operations are directed in part by state signal 52. When microsequencer 42 is in an appropriate state, data received by network interface 60 is transferred from network interface 60 to command register 56 by data bus 62 in conjunction with load signal 58. Command register output 59 defines a portion of address signal 44. Network interface 60 also connects via data bus 62 to memory 64, register array 66, flag register 84, and random number generator 90 for transfer of data between these function blocks, for storage of received data, and for recall of data to be sent.*

*In one embodiment, data bus 62 is byte-wide. Network interface 60 converts received data from serial to byte-par-*

*allel organization. The several devices that connect to data bus 62 make a byte-parallel connection.*

*In another embodiment, data bus 62 is bit-serial. Control bus 54, in such an embodiment, includes serial clock signal (not shown), Register transfer among network interface 60, register array 66, memory 64, flag register 84, and random number generator 90 are accomplished in bit-serial fashion with appropriate electrical interfaces known in the art.*

*In yet another embodiment, a combination of serial and parallel data paths are implemented. The system designer's choices of serial or parallel as well as the number of bits per register transfer operation, depends on factors including system and device timing limitations, noise immunity, power dissipation, device size, topology, and layout constraints.*

*Memory 64 connects to read/write signal 68 and memory address signal 70 which are part of control bus 54. Memory 64 is used to store values for responder station identification and data related to the communication system application. For example, when a responder station is used as an airline baggage tag, postal mailing label, or inventory control tag, memory 64 would store data describing a destination for the item to which the tag is attached.*

*Register array 66 performs functions similar to a multiport memory. Register array 66 connects to arithmetic-logic unit (ALU) 72 for the presentation of operand signals 74 and 76, and storage of result signal 78. Operand and result signals are multi-bit digital signals for arithmetic operations such as addition, bit-wise parallel logical operations such as logical-AND, and bit-wise serial operations such as shift-left. Register array 66 connects to control bus 54 so that registers to be coupled to operand and result signals are selected and stored according to state signal 52.*

*In addition to the connections already described, a portion of control bus 54 connects to ALU 72 to supply opcode signal 80 to ALU 72. Opcode signal 80 selects one of a plurality of possible operations to be conducted by ALU 72. When an equality comparison has been selected by opcode signal 80 and operand signals 74 and 76 are bitwise identical, A=B signal 82 is asserted by ALU 72. A=B signal 82 defines a portion of address signal 44.*

*Control bus 54 connects to individual bits arranged in flag register 84. Addressed-bit 86, part of flag register 84, is set under control of state signal 52 to indicate whether responder station 40 has been addressed in a received command message. Locked-bit 88, also part of flag register 84, is set under control of state signal 52 to indicate whether responder station 40 should ignore messages from a commander station because responder station 40 has already announced its identification to a commander station. The significance of addressed-bit 86 and locked-bit 88 will become more readily apparent in the description below.*

*Random number generator 90 connects to control bus 54 and data bus 62 for transferring a random number of a predetermined precision to register array 66. When retained in register array 66, the random number is called an ARBITRATION NUMBER whose function will be discussed below. Circuit techniques for generating a random number in digital format are well known and described, for example, by H. F. Murray in "General Approach for Generating Natural Random Variables", IEEE Transactions on Computers, Vol. C-19, No. 12, pp 1210-1213, December 1970, incorporated herein by reference. In one embodiment, random number generator 90 is similar to an integrated circuit implementation described by Alan Folmsbee, et. al., in their article, "128K EPROM with Encrypted Read Access", published in the Digest of Technical Papers IEEE International Solid-State Circuits Conference pp 46-47 and 103, by Lewis Winner, Coral Gables, Fla., 1985, incorporated herein by reference.*

*FIG. 2 of the '551 patent is a functional block diagram of network interface 26 shown in FIG. 1 of the '551 patent. Within network interface 26, connecting signal 28c couple to output buffer 110. Byte-parallel loading of output buffer 110 is accomplished by network interface peripheral controller 20c shown in FIG. 1 of the '551 patent. Bytes are removed from output buffer 110 by transmitter logic 112 to accomplish several processing objectives. In one embodiment, a 5-bit cyclic redundancy check (CRC) code is joined to each 8-bit byte to form a 13-bit word. Redundancy, provided by the 5-bit code, facilitates error detection and limited error correction by responder station 40. Table 1 describes the format of the 13-bit word and includes a description of the eRC code used in one embodiment. Suitable CRC encoder and decoder circuits used in transmitter logic 112 and receiver logic 178 are described in detail in "Error Control Coding:Fundamentals and Applications," by Shu Lin and Daniel J. Costello Jr., Prentice-Hall Englewood Cliffs, N.J. 1983, pp 62-94. Transmitter logic 112 also generates transmit serial bit stream 114 which includes a message preamble bit stream, one or more successive 13 bit words from output buffer 110, and a postamble bit stream. When permitted by OK-totransmit signal 116, transmit serial bit stream 114 is presented to transmitter 118. Transmitter 118 in one embodiment produces a radio frequency transmit signal 120 by modulation and couples that signal to antenna 122. Appropriate modulation methods depend on the communication medium.*

*TABLE 1*

| | |
|---|---|
| *Bit Order of Transmission* | *D7, D6 . . . D0, P4, P3, . . . PO (PO transmitted first)* |
| *CRC Generation Equations* | *PO = 01 + 02 + 05 + 07* |
| | *P1 = 01 + 03 + 04 + 06* |
| | *P2 = 0 + D2 + 03 + 06 + 07* |
| | *P3 = 00 + 04 + 05 + 06 + 07* |
| | *P4 = 00 + 01 + 02 + 03 + 04 + 05* |

*For a communication system for airport baggage handling, modulation includes, for example, spread spectrum modulation having pseudo noise characteristics. Other techniques for transmitter design appropriate to radio transmission and other media will be readily apparent to those skilled in the arts applicable to communication on a particular medium. A power level of approximately 1 watt is sufficient to excite responder station network interface 60 at distances and noise levels typically required for a communication system for airport baggage handling.*

*Receiver 124 is coupled to antenna 122 for amplifying and filtering radio frequency received signal 126. Receiver 124 derives OK-to-transmit signal 116 from power level measurements on received signal 126 and provides signal 116 to transmitter logic 112. Although responder station network interface 60 need not generate a transmitted signal using the same modulation technique employed in transmitter logic 112 and transmitter 118, a common method is preferred, for example, in order to minimize circuitry in responder station network interface 60. Thus, receiver 124 removes the carrier signal and other artifacts of modulation generated by responder station network interface 60 in one embodiment by synchronizing with the spread spectrum signal and removing pseudo noise characteristics through known detection and filtering methods. Resulting received serial bit stream 128 is coupled to receiver logic 130, in one embodiment, for determining whether a proper message has been received and for decomposing the message into successive 8 bit bytes. The*

*method and circuitry required to determine whether a proper message has been received depend on the redundancy that responder station network interface 60 incorporates into received serial bit stream 128.*

*For a communication system for airport baggage handling, responder station 40 may transmit at a power level of 1 milliwatt or less. Multiple and more sophisticated error detection schemes transmitted from responder station 40 will extend the limit of physical separation between commander station 10 and responder station 40. Error detection schemes are well known. Such schemes may also permit reliable communication in environments having substantial noise levels. On the other hand, limits to the complexity and power consumption of responder station 40 may limit the extent of encoding circuitry therein. Where responder station network interface 60 facilitates one or more particular error detection schemes, receiver logic 128 decomposes, decodes, detects, and to a limited extent corrects errors in received serial bit stream 128. In one embodiment, receiver logic 130 determines proper-message-received signal 132 by decoding Viterbi encoding using model Q1601 decoder available from Qualcomm, Inc., San Diego, Calif. according to Qualcomm application notes and the parameters: Rate R=½, Generating Functions GO=171(octal) and G1=133(octal), and Constraint Length K=7. Receiver logic 130 also performs serial to parallel conversion to produce successive 8-bit bytes which are stored in input buffer 134.*

*Network interface peripheral controller 20c, responsive to OK-to-transmit signal 116 and proper-message-received signal 132, generates signals on data and control bus 14 from which central processor 16 can determine whether a proper message has been received as of a predetermined time after transmission and if not, whether no message was received. Other control signals, known in the art and not shown, are generated and sensed to orchestrate the loading of output buffer 110 and the unloading of input buffer 134 under control of central processor 16.*

*FIG. 3 of the '551 patent is a functional block diagram of responder station network interface 60 shown in FIG. 1 of the '551 patent. The configuration illustrated in FIG. 3 of the '551 patent performs functions similar to those already described above for commander station network interface 26. Differences between the two serve primarily to limit the complexity of responder station circuitry. Data bus 62 connects to transmitter logic 160. When directed by microseguencer 42 via signals on control bus 54, transmitter logic 160 generates a message preamble bit stream. Then, for each bit of each word read from memory 64 or register array 66, transmitter logic 160 develops a Viterbi code. Functional descriptions suitable for designing circuits or computer programs for generating Viterbi and similar convolutional codes are explained in "Error Control Coding: Fundamentals and Applications," by Shu Lin and Daniel J. Costello Jr., PrenticeHall Englewood Cliffs, N.J. 1983, pp 287-456; and "Error-Correction Coding for Digital Communications", by George C. Clark, Jr. and J. Bibb Cain, Plenum Press, New York, N.Y. 1981, pp 227-266. Message signal 162 presents the codes to transmitter 164. Following the last code, transmitter logic 160 generates a message postamble bit stream. Transmitter 164 modulates message signal 162 in a way compatible with receiver 124 and receiver logic 130. The resulting transmit radio frequency signal 166 is coupled to antenna 168. Redundancy, provided by the Viterbi codes, facilitates error detection and limited error correction when the message is received at commander station 10.*

*Receiver 170 is coupled to antenna 168 for amplifying and filtering radio frequency received signal 172. Receiver 170 derives wake-up signal 174 from power-level measurements on received signal 172 and provides wake-up signal 174 to power control and restart circuits not shown. In a communication system for airport baggage handling, non-critical circuitry in responder station 60 is powered by battery only after the preamble of a packet has been detected. Receiver 170 also removes the carrier signal and other artifacts of modulation generated by commander station network interface 26 in one embodiment by synchronizing with the spread spectrum signal and removing pseudo noise characteristics through detection, demodulation, decoding, and filtering methods known in the radio communication arts. Resulting received serial bit stream 176 is coupled to receiver logic 178. In one embodiment, receiver logic 178 performs several functions: Determining whether a proper byte has been received, consequently generating improperbyte-received signa/180, and decomposing the packet into successive 8-bit bytes forming received message signal 182. The method and circuitry required to determine whether a proper byte has been received depend on the redundancy that commander station network interface 26 incorporates into transmit serial bit stream 114. Receiver logic 178 detects the first byte of a command and in response generates load signal 58. Clock signal 46 is also generated by receiver logic 178 to drive state register 50.*

*Microsequencer 42 and network interface 60 cooperate via control bus 54 which includes improper-byte-received signal 180. Other signals included in control bus 54, known in the art and not shown, orchestrate transfer of bytes between memory 64, register array 66, transmitter logic 160, and receiver logic 178. If an improper byte is received, as indicated by improper-byte-received signal 180, microsequencer 42 responds by reverting to an idle state and ignoring incoming bytes until another command is received.*

*For a detailed description of suitable circuits of the type that can be used for transmitters 118 and 164 and receivers 124 and 170, implemented in spread spectrum technologies, see U.S. Pat. No. 5,121,407 by Partyka et al., incorporated herein by reference.*

*FIG. 4 of the '551 patent is a diagram of the packet format sent by commander station 10 to responder station 40. Each command packet 140 includes, in order of transmission, a preamble followed by a command followed by a postamble. The preamble and postamble are designed for synchronizing a transmitter circuit and a receiver circuit for a particular packet.*

*In one embodiment, the preamble bit stream comprises 768 '1' bits followed by a 7-bit Barker code of '0001101'. In one embodiment, the postamble comprises a 7-bit Barker code of '1110010'.*

*In one embodiment, each bit of the command format is modulated using a pseudo noise (PN) sequence for direct sequence spread spectrum communication. The sequence is generated in part by a linear feedback shift register (LFSR) of the form [5,2]. In this form, the input to the first of five registers is the result of combining the output of register 5 by exclusive-OR with the output of register 2. The generator in this embodiment has 32 states so that the 1 and 0 states occur with equal probability. Since the LFSR generates only 31 states, an additional state is inserted by support circuitry. For a detailed description of a suitable PN modulator circuit of the type employed in transmitter 118 see "Spread Spectrum Systems", by R. C. Dixon, published by John Wiley and Sons, Inc. 1984 pp 1528 and 56-151 incorporated herein by reference. Suitable demodulator techniques and circuits (of the*

*type used in receiver 170 to recover the response format) are also described at pages 153-290 incorporated herein by reference.*

*FIG. 5 of the '551 patent is a table that describes several commands and refers to command formats described in FIG. 6 of the '551 patent. As shown in FIG. 6 of the '551 patent, each command begins with an opcode and has one of four formats varying in length from 3 bytes to 258 bytes. Opcode values were selected to facilitate accurate decoding and obtain high noise immunity. Each byte is an 8-bit word as it would appear in output buffer 110 and on received message signal 182. The opcode hexadecimal value is stored on receipt in command register 56. Bytes following the opcode have the following meanings. MASK and BRANCH as used in format 142 are binary numbers chosen by a commander station to specify a group of responder stations that should act on the command and should reply. LOCAL ID in format 142 is a unique identification number assigned, for example, by the communication system installer to each commander station 10, 34 coupled to common medium 32. Responder stations 36, 40 coupled to common medium 32 can then direct a response to one of several commander stations 10,34 by, for example, including a particular LOCAL ID in each response. When one commander station chooses to specify only one responder station that should act on a command and should reply, that commander station includes in its command an ARBITRATION NUMBER as in formats 144 and 146 identifying the responder station. An ARBITRATION NUMBER is a short value, for example 1 byte, chosen for self identification by a responder station. On the other hand, A TAG, as in format 146, is a long value, for example 8 bytes, assigned by a communication system designer at the time a responder station is manufactured or commissioned. The ARBITRATION NUMBER distinguishes responder stations when coupled simultaneously with at least one commander station to a common medium. However, the TAG, distinguishes responder stations throughout the life of the communication system application. Finally, DATA in format 146 includes some or all of the contents for any or all devices including memory 64, register array 66, flag register 84, and random number generator 90.*

*FIG. 7 of the '551 patent is a diagram of the packet format sent by responder station 60 to commander station 10. Each response packet 190 includes, in order of transmission, a preamble followed by a response followed by a postamble. The preamble and postamble are designed for synchronizing a transmitter circuit and a receiver circuit for a particular packet. In one embodiment, the preamble bit stream comprises 768 '1' bits followed by a 7-bit Barker code of '0001101'. In one embodiment, the postamble comprises a 7-bit Barker code of '1110010'.*

*In one embodiment, each bit of the response format is modulated using a pseudo noise (PN) sequence for direct sequence spread spectrum communications. The sequence is generated in part by a linear feedback shift register (LFSR) of the form [6,1] or [8,4,3,2] for either a 64 chip sequence or a 256 chip sequence respectively. In the form [6,1], the input to the first of six registers is the result of combining the output of register 6 by exclusive-OR with the output of register 1. Similarly, for the [8,4,3,2] form, the input to the first of eight registers is the result of the exclusive-OR of the outputs of registers 8, 4, 3, and 2. The 64 chip sequence requires less time for signal synchronization than the 256 chip sequence; however, the latter provides better performance in systems having poor signal to noise ratio. The generator in this embodiment has an even binary multiple of states, so that the 1 and 0 states occur with equal probability. Since the LFSR generates one less state, an additional state is inserted by support circuitry. For a detailed description of a suitable PN modulator circuit of the type employed in transmitter 164. see "Spread Spectrum Systems", by R. C. Dixon, published by John Wiley and Sons. Inc. 1984 pp 1528 and 56-151 incorporated herein by reference. Suitable demodulator techniques and circuits of the type used in receiver 124 to recover the response format are also described at pages 153-290 incorporated herein by reference.*

*FIG. 8 of the '551 patent is a table that describes several responses and refers to response formats described in FIG. 9 of the '551 patent. As shown in FIG. 9 of the '551 patent, response formats 192-196 include LOCAL ID. ARBITRATION NUMBER, and TAG, which have the meanings already described above. By including LOCAL ID and ARBITRATION NUMBER in each response, in cooperation with locked bit 88 one responder station can respond unambiguously to one commander station in the presence of a plurality of commander and responder stations. The INVERTED ARBITRATION NUMBER in format 192 is the binary ones-complement of the ARBITRATION NUMBER and is included for increased accuracy of communication. REVISION in format 192 is a one-byte value set by a communication system developer at the time of manufacture or commissioning of a responder station. REVISION represents the responder station configuration and connotes its capability. STATUS in format 196 is a one-byte code chosen by responder station 40 to convey current conditions of important system events such as low battery, uncorrectable data received. write protection. And similar information which may indicate to commander station 10 that communication should be repeated or abandoned. DATA in response format 194 includes some or all of the contents of any or all devices including memory 64, register array 66, flag register 84, or random number generator 90.*

*A communication system, according to the present invention as described in the '551 patent, includes commander and responder stations that adhere to a method of communicating called a protocol. In general, the protocol of the present invention as described in the '551 patent places different requirements on a commander station than on a responder station. Thus, there is a commander station method (FIG. 10 of the '551 patent) and a responder station method (FIG. 11 of the '551 patent). These methods together implement the communication system protocol.*

*Operation according to the present invention as described in the '551 patent produces the following characteristic effects at the system level. First, a commander station will not begin transmitting during the transmission by another commander station or by a responder station. Operation, according to the present invention as described in the '551 patent, does not prevent more than one commander station from beginning transmission simultaneously; however, it is feasible to couple commander stations to a second medium or to constrain commander stations to a second or expanded protocol on common medium 32. For example, commander stations 10 and 34 include personal computer system 12, which can be augmented with a peripheral controller for operation over ethernet. Communication over the second medium can be used to prevent simultaneous broadcast over common medium 32. For example, a second protocol on common medium 32 may include operator action to assign time slots, back off delays, or similar means for media access whether central or distributed. Several embodiments for these means for media access have been described by Stallings in his work already incorporated by reference above.*

*Second, a responder station will not transmit unless it has first received a command to which it determines it must respond. The response is made within a predetermined time immediately following receipt of the command.*

*Third, a commander station can form a command in a manner calling for all, more than one, or one responder station to respond. An important object of the communication system protocol in a communication system of the present invention as described in the '551 patent, i.e. uninterrupted communication, is achieved after a commander station determines how to cause only one responder station to respond. The program flow diagram of FIG. 10 of the '551 patent and the state diagram of FIG. 11 of the '551 patent describe how uninterrupted communication between one commander station and each responder station is achieved when a plurality of commander stations and a plurality of responder stations are simultaneously coupled to a common medium.*

*FIG. 10 of the '551 patent is a program flow diagram of the protocol followed by a commander station of the present invention as described in the '551 patent. A practical example of a communication system will be used to describe the flow diagram.*

*In a communication system for airport baggage handling the quantity and identity of responder stations within the radio communication range of a commander station varies over time. A commander station may be at a fixed operator station within radio range of a moving belt conveying baggage toward a V-junction of conveyors. When baggage tags are constructed as responder stations and when each tag has destination information stored in memory 64, the commander station, through communication with each baggage tag, can control the routing of each bag through the junction onto one of two conveyors. Assume that each responder station also has information in memory 64 describing its sequential position on the conveyor. Such a sequence number could be a date and time of day when the bag passed through a chute upstream of the commander station.*

*As a group of bags approaches the commander station, the commander station has a fixed amount of time to determine the identity of each responder station, in order to establish uninterrupted communication. For proper baggage handling, the commander station must routinely and repeatedly identify all bags on the conveyor. To do so, at FIG. 10 of the '551 patent block 210, commander station 10 specifies a group of responder station addresses by choosing values for BRANCH and MASK. BRANCH and MASK values are determined in a manner to be explained by reference to FIG. 12 of the '551 patent below. In one embodiment, the initial group specification, i.e. BRANCH and MASK values, would specify all possible responder stations. Commander station 10 at block 212 generates an "identify, clear, and generate" (IDCG) command having a format according to FIGS. 4,5, and 6 of the '551 patent. When the media is clear to broadcast, block 214, as indicated by OK-to-transmit signal 116, the IDCG message is broadcast, block 216. An IDCG message causes each responder station that is a member of the group to clear locked-bit 88, generate a random number and retain it as its ARBITRATION NUMBER, and broadcast a response. The responder station's reactions to 10, lOG, IDC, and IDCG commands are explained further in reference to FIG. 11 of the '551 patent below.*

*Commander station 10 now loops through blocks 220 and 218 for a response to be received as indicated by OK-to-transmit signal 116 or a time out elapsed condition. If a response was received, as indicated by a false state of OK-to-transmit signal 116, commander station 10 at block 222 determines whether a collision occurred. as indicated by a false state of proper-message-received signal 132. If commander station 10 determines that a collision occurred. it will determine at block 224 whether all possible members of the initial group of responder station addresses specified at block 210 have been addressed in an 1D, lDG, IDC, or IDCG command. How this determination is made will be further explained with reference to FIG. 12 of the '551 patent below. If all subgroups have not been tried, the commander station again specifies a group of responder station addresses, for example, a subgroup or disjoint group of a prior group. At block 228 commander station 10 generates an 10 command according to FIGS. 4, 5, and 6 of the '551 patent and continues the method from block 214.*

*If, at block 218, a predetermined time elapsed without a false condition appearing on OK-to-transmit signal 116, commander station 10 concludes that no response was transmitted and continues the method at block 224.*

*If, at block 222, the proper-message-received signal is true, then commander station 10 concludes that only one responder station responded. At block 230, commander station 10 determines and validates the responding responder station's ARBITRATION NUMBER according to response format 192 using ARBITRATION NUMBER and INVERTED ARBITRATION NUMBER. According to a particular system communication objective, commander station 10 now selects a command from FIG. 5 of the '551 patent which will cause the responder station to set its locked-bit 88. For determining baggage destination and positional sequence on the conveyor, commander station 10 could select RD. Using the appropriate command format shown in FIG. 6 of the '551 patent, commander station 10 generates a message at block 232, loops until the OK-to-transmit signal indicates that the medium is clear to broadcast at block 234, then broadcasts the command at block 236. Commander station 10 again awaits a proper response message by looping at block 238 through block 240. If a predetermined time elapses at block 240, commander station 10 continues the method at block 234. If a response is received without error at block 244, as indicated by proper-message-received signal 132, then two party uninterrupted communication between commander station 10 and one responder station 60 has been established. Further communication may be required, as indicated by the STATUS code in the received response format 192 or to accomplish other system communication objectives.*

*It is possible at block 224 for the commander station to determine that no further subgroup, super group, or disjoint group remains to be commanded using the 10 command. Suppose, for example, that all practical values of BRANCH and MASK have been used. If the immediately preceding broadcast at block 216 elicited no response at block 218, then commander station 10 can conclude that all responder stations have been identified. Otherwise, at block 248, commander station 10 generates an identify and generate command (lOG) according to the format in FIGS. 4, 5, and 6 of the '551 patent using the same group that was specified in block 210. Commander station 10 continues the method at block 214.*

*Although the same group is specified, a responder station that has been identified at block 244 will not respond, since its locked-bit 88 has been set. Collisions are less likely to occur with each pass through the loop from block 214 to block 248 because a smaller number of responder stations can respond. Hence, the method of FIG. 10 of the '551 patent converges toward identifying all responder stations. The communication system designer must select the precision of BRANCH and MASK values to assure conversion within system time allowances, for example, 8-bit BRANCH and MASK values*

*are compatible with conveyor speeds and radio ranges needed for airport baggage handling.*

*FIG. 11 of the '551 patent is a state diagram of the protocol followed by a responder station of the present invention as described in the '551 patent. Responder station 40, begins in idle state 310 when power is applied or restored according to wake-up signal 174. In part, the idle state is indicated by contents of command register 56 not corresponding to a valid command. The idle state is re-entered to interrupt command processing when improper-byte-received signal 180 is raised by receiver logic 178. A valid command loaded into command register 56 causes state transition to address check state 312.*

*In address check state 312, microsequencer 42 determines whether responder station 40 has been addressed by one of two methods. First, if the command conforms to format 142, the responder station is addressed when the result of ARBITRATION NUMBER logically ANDed with MASK is bitwise identical to BRANCH. ARBITRATION NUMBER is the current contents of a particular register in register array 66. MASK and BRANCH are values received in the command and stored in register array 66. Logical operations and comparisons are performed by ALU 72 which produces A=B signal 82. If A=B signal 82 is not asserted, state 314 is entered. Responder station 40 may remain in state 314 until a predetermined time elapses. Responder station 10 re-enters idle state 310, after the predetermined time elapses.*

*To illustrate the importance of such a delay, suppose that commander and responder stations employed radio transceivers for network interfaces 60 and 26. Then, suppose responder station 40 is within range of two commander stations 10 and 34, but commander stations 10 and 34 are out of range of each other. When commander stations 10 and 34 validly produce back to back commands, the delay interposed by state 314 prevents responder station 40 (not addressed by commander station 10 in the first occurring command) from responding to commander station 34 in the second occurring command. Without the delay, a collision could occur that may confuse commander station 10.*

*A second way to determine whether responder station 40 has been addressed applies for commands having formats 194 and 196. Accordingly, responder station 40 is addressed when ARBITRATION NUMBER, retained in register array 66, is bit-wise identical to ARBITRATION NUMBER as received in the command. Comparison is performed by ALU 72 which produces A=B signal 82. If A=B signal 82 is not asserted, state 314 is entered as already described. Otherwise, transition is made to decode state 316.*

*Decode state 316 follows address check state 312 in response to A=B signal 82. If the command opcode is not recognized then no response state 314 is entered. For some commands, a further condition such as the state of locked-bit 88, if not met, will cause the command to be treated as not recognized. Each recognized command opcode causes microcode execution to begin at a section of microcode for the purpose of directing microsequencer operations to process the particular received command. Four commands are illustrated as separate states 318 through 324 and other commands are illustrated in summary by pseudo state 326.*

*When the opcode for command IDCG has been received, state 318 is entered for identify, clear, and generate operations. An lOR response (according to FIGS. 8 and 9 of the '551 patent) is selected, locked-bit 88 is cleared, the content of random number generate 90 is stored in register array 66 as ARBITRATION NUMBER, and transition is made to state 328.*

*When the opcode for command lDG has been received and locked-bit 88 is not set, state 320 is entered for identify, and generate operations. An lOR response is selected and a new ARBITRATION NUMBER is generated as already described for state 318. Transition is then made to state 328.*

*When the opcode for command IDC has been received, state 322 is entered for identify and clear operations. An lOR response is selected and locked-bit 88 is cleared. Transition is then made to state 328.*

*When the opcode for command 10 is received and locked-bit 88 is not set, state 324 is entered for an identify operation. An lOR response is selected. Transition is then made to state 328.*

*When the opcode for other commands (including RD and WD) is received, lockedbit 88 may be set and other functions may be performed. Other functions may include writing data to memory 64, writing data to register array 66, altering the state of registers including flag register 84, and other operations controlling responder station configuration and operation. Transition is then made to state 328.*

*Upon transition to state 328, the response selected by a prior state is generated according to FIGS. 7, 8, and 9 of the '551 patent and broadcast. In one embodiment, the response is broadcast as it is being generated. Transition to idle state 310 is made, after broadcasting the response. Note that responder station 40 does not wait for clear medium prior to broadcasting the response. According to the present invention as described in the '551 patent, collision detection by responder stations is not necessary to accomplish uninterrupted communication.*

*The ARBITRATION NUMBER generated by responder station 40 and the BRANCH and MASK numbers chosen by commander station 10 operate to establish uninterrupted communication. We now turn to a further explanation of the method used by commander station 10 to choose BRANCH and MASK values.*

*FIG. 12 of the '551 patent is a binary tree diagram of BRANCH values and MASK values chosen by a commander station. A tree is a type of graphic representation. There are several types of trees known in mathematics and computer science. The tree depicted is a binary tree where a node can have two branches, shown descending left and right from a node. Each node corresponds to a unique combination of values for BRANCH and MASK, which are nbit binary numbers having the same precision. As illustrated, BRANCH and MASK are n-bit binary numbers. In a communication system for airport baggage handling, a-bit numbers would be used. The precision employed for BRANCH and MASK must be identical to the precision selected for ARBITRATION NUMBER generated by responder station 40.*

*Recall that responder station 40 uses the expression ARBITRATION NUMBER AND MASK=BRANCH to determine if it is addressed, where ARBITRATION NUMBER is the value retained in register array 66 from random number generator 90. When MASK is 0 and BRANCH is 0 all values of ARBITRATION NUMBER satisfy the expression, i.e. all responder stations coupled to common medium 32 conclude they are addressed. On the other hand, if MASK has a '1' bit in every position, then the expression is satisfied for only one value of ARBITRATION NUMBER.*

*When MASK is arranged with '0' and '1' bits, the expression is satisfied by a group of values for ARBITRATION NUMBER, and potentially a group of responder stations could conclude they are addressed. Note for a responder station to be addressed, BRANCH at bit position 'q' must be '0' when MASK at bit position 'q' is '0', for all values of 'q'. When MASK at bit position 'q' is '1', BRANCH can take two values for that bit position which correspond to the left and right branches of a binary tree.*

*At the first level of the tree, nodes 702 and 703, MASK is '1' in bit position 'r'. The corresponding bit position of BRANCH is '0' at node 702 and '1' at node 703. At the second level of the tree, nodes 704 through 707, MASK is '1' at bit positions 'r' and 's'. For example, the value for BRANCH at node 707 is the parent node BRANCH value (001 at node 703) modified by forcing a '1' (for the right-hand branch) at bit position 's', hence 011. In like manner, the BRANCH and MASK values for any node in the tree can be determined. In FIG. 12 of the '551 patent MASK bit positions have been given in an order right to left. Any other order of bit positions would be equivalent. Methods for choosing first and subsequent values for BRANCH and MASK can now be explained in terms of traversing from node to node on a binary tree.*

*When commander station 10 broadcasts a request for identification (an ID, IDC, lDG, or IDCG command) one of three events can occur. BRANCH and MASK values given at a particular node that represents a first group of responder stations. First, commander station 10 could receive no response from which it could conclude that no responder station in the first group is currently coupled to the common medium 32. Second, a proper response could be received. From that event, commander station 10 could conclude that only one responder station in the first group is currently coupled to common medium 32. Third, from an improper response received, commander station 10 could conclude that a collision of more than one response occurred. An improper response could be caused by, for example, weak coupling, high noise levels, or weak received signals. However, these causes can be treated in the same way as a collision to simplify the commander station protocol without substantially degrading system performance for applications including airport baggage handling. Therefore, an improper response simply merits further search.*

*An efficient search for the identity of each of several responding responder stations is equivalent to an efficient search for the leaves of a binary tree. A leaf is a node having no further branches. When use of the values for BRANCH and MASK at a node produces no collision, the node is a leaf. Tree search methods are easily implemented using known computer programming methods.*

*Tree search methods are essentially of two types, breadth first and depth first. A particular communication system application may use one method or the other to optimize commander station computing time and memory space objectives. An explanation of these methods using the programming language PASCAL is given by E. Horowitz and S. Sahni in "Fundamentals of Data Structures in PASCAL" pp 203-265 and 326-332 published by Computer Science Press Inc., Rockville, Md. (1984), incorporated herein by reference.*

*Suppose that two responder stations 40 and 36 and one commander station 10 are coupled to common medium 32. The binary tree in FIG. 12 of the '551 patent illustrates a sequence of BRANCH and MASK values used by commander station 10 to identify responder stations. Timing diagrams in FIGS. 13 and 14 of the '551 patent illustrate the same sequence showing decisions at commander station 10 decision blocks (according to the commander station method of FIG. 10 of the '551 patent) and responder station control signals (according to the responder station method of FIG. 11 of the '551 patent) as commander station 10 establishes uninterrupted communication with each responder station.*

*Beginning at FIG. 10 of the '551 patent block 210, FIG. 12 of the '551 patent node lOt and FIG. 13 of the '551 patent time 810, commander station 10 chooses BRANCH=000 and MASK=000, calling for all responder stations to respond. At time 815, responder station 40 has determined that it is addressed, has cleared its locked-bit 88, has generated ARBITRATION NUMBER 101, and has begun transmitting response lDR. Simultaneously, responder station 36 has determined that it has been addressed, has generated ARBITRATION NUMBER 111, and has begun transmitting response lDR. Also, at time 815, simultaneous transmissions collide on common medium 32.*

*At time 820, commander station 10 at block 226 chooses node 702 having BRANCH=OOO and MASK=001. Responder station 40 is not addressed because ARBITRATION NUMBER (101) ANDed with MASK (001) yields 001 which is not equal to BRANCH (000). Similarly, responder station 36 is not addressed. Neither station responds. At time 826, time out at block 218 occurs.*

*At time 830 and block 226, a third group of responder station addresses is chosen. From FIG. 12 of the '551 patent the appropriate group is specified by traversing the tree according to a search method. If a breadth first search were used, all nodes at the same level would be visited before testing at a deeper level. Hence, node 703 would be next. If a depth first search were used, search would proceed upward from node 702 (because it is a leaf) and then downward from the first node having an untested branch. Hence, up to node 701 and down to node 703. As a refinement to either method, node 703 can be skipped because a collision at node 701 and no response at node 702 implies a collision at node 703 without testing. A depth first search would now traverse from node 703 directly to node 706. A breadth first search would first consider nodes 704 and 705 and conclude not to visit them because each is a descendent from a leaf node.*

*Having selected node 706 at time 830, commander station 10 broadcasts an 10 command with BRANCH=001 and MASK=011 at block 216. At time 835 responder, station 40 has determined that it is addressed and has begun transmitting response IDR. Simultaneously, responder station 36 determines it is not addressed and remains in state 314. At time 840, shown on FIGS. 13 and 14 of the '551 patent, commander station 10 has received the response from responder station 40 as a proper message, concluded that only one responder station responded, derived received ARBITRATION NUMBER (101), set BRANCH to received ARBITRATION NUMBER, set MASK to all 1's so that a responder station must match ARBITRATION NUMBER (101) in all bit positions to respond, and begins to perform blocks 232 through 244 in FIG. 10 of the '551 patent. At time 845, responder station 40 has determined that it is addressed, has decoded a read command, has set its locked-bit 88 in state 326, and has begun generating the read response in state 328. At time 850, commander station 10 has received the response as a proper message. Thus, commander station 10 has conducted a first two-party uninterrupted command-response scenario from time 840 to time 850 with one responder station.*

*The search by commander station 10 for another responder station proceeds from block 244 to block 224 in FIG. 10 of the '551 patent. At block 226, another node from FIG. 12 of the '551 patent is selected. Having elicited a proper response at node 706, the depth first search proceeds up to the first node having an untested branch, here node 703. Then, down the untested branch to node 707. Having selected node 707 at time 850, commander station 10 broadcasts an 10 command with BRANCH=011 and MASK=011 at block 216. At time 855, responder station 36 has determined that it has been addressed and has begun generating an lOR response. At time 860, the response is received by commander station 10 as a proper message. After time 860, events proceed in a manner similar to events from time 840 to time 850, as commander*

*station 10 conducts a second two-party uninterrupted command-response scenario with a second responder station.*

*At block 224, following the uninterrupted scenario, commander station 10 can conclude that all groups have been tested. On a depth first search, a proper response or no response at a node having BRANCH=MASK indicates all groups have been tested. On a breadth first search, all groups have been tested when an investigation of all levels up to the level having all MASK bits set to '1' yields no node that is not descendent from a leaf node.*

*In a branch/mask embodiment of the type described above, a responder station concludes that it has been addressed when ARBITRATION NUMBER logically ANDed with MASK is equal to BRANCH. Two other types of embodiments will now be described that lie within the scope and spirit of the present invention as described in the '551 patent. First, in an example of a high/low embodiment, BRANCH and MASK (as shown in format 142) are replaced with HIGH LIMIT and LOW LIMIT. Each of these limit values has the same precision as the MASK value. Using these limit values, responder station 40 concludes that it is addressed when HIGH LIMIT is greater than or equal to ARBITRATION NUMBER, and LOW LIMIT is less than or equal to ARBITRATION NUMBER. Second, in an example of a limit/bound embodiment, BRANCH and MASK (as shown in format 142) are replaced with a single LIMIT value having the same precision as MASK. Using a value called BOUND which by design choice may be 0 or the maximum permitted by the precision of LIMIT, responder station 40 concludes that it is addressed when ARBITRATION NUMBER is between BOUND and LIMIT, inclusive of both BOUND and LIMIT values.*

*An example of a limit/bound embodiment is implemented with a structure similar to that already described for the branch/mask embodiment. Subtraction capability or equivalent must be added to ALU 72. Operation of microsequencer 42 must be revised to perform the arithmetic operations outlined above in state 312 shown on FIG. 11 of the '551 patent. The high/low embodiment is implemented with the structure already described for the limit/bound embodiment.*

*In FIG. 10 of the '551 patent (blocks 210 and 226) commander station 10 specifies a group of responder station addresses. For a branch/mask embodiment, a method using the binary tree of FIG. 12 of the '551 patent has already been discussed. For a high/low embodiment, a similar binary tree (not shown) with HIGH and LOW values at each node is used. At the root node, LOW is 0 and HIGH is the maximum value permitted by the precision of the value HIGH. At a node on the lower left from a parent node, the value of LOW is the value of LOW at the parent node and the value of HIGH is a value ½ the value of HIGH at the parent node discarding a remainder, if any. At a node on the lower right from a parent node, the value of HIGH is the value of HIGH at the parent node and the value of LOW is ½ the value of HIGH at the parent node plus one. Although a binary tree has been described, a tree having more than two branches at each node can be employed to practice the present invention as described in the '551 patent as is readily apparent to those skilled in the art. Trees with varying number of branches at each node can also be employed. Operation of the high/low embodiment is otherwise identical to operation of the branch/mask embodiment already discussed.*

*In a limit/bound embodiment, the method used to specify a group of responder station addresses is similar to the method described for a high/low embodiment with a minor variation in the tree. When BOUND is zero, then the value for LOW is not used and the value for HIGH is used as the LIMIT value at each node. When BOUND is a maximum value, then the value for HIGH is not used and the value of LIMIT at each node is the value of LOW. Operation of a limit/bound embodiment is otherwise identical to operation of a branch/mask embodiment already discussed. Note that the command at block 232 on FIG. 10 of the '551 patent sets locked-bit 88 to prevent unnecessary collisions when an 10 command using LIMIT is broadcast subsequently at block 228.*

*FIG. 15 of the '551 patent is a fibonacci tree diagram for use in an example of an embodiment of the type already described as limit/bound. An advantage of using a fibonacci tree is that the LIMIT value for a node descendent from a parent node can be derived without a multiplication or division operation. In systems where it is desirable to improve calculation speed or reduce the complexity of circuitry and software at commander station 10, the fibonacci tree is used. An implementation of a high/low embodiment using a fibonacci tree similar to FIG. 15 of the '551 patent is within the ordinary skill of the systems design and programming arts.*

*As described in several embodiments above, a commander station can quickly determine the identity of all responder stations coupled to a common medium at a given time. After the identity of a responder station has been determined, a commander station can conduct uninterrupted communication at any subsequent time using the responder station's ARBITRATION NUMBER. Since the ARBITRATION NUMBER is not unique, there is some risk that at a subsequent time, more than one responder station having a given value for ARBITRATION NUMBER may become coupled to the common medium. For increased accuracy, use of a unique responder station identity, such as the TAG field in format 146 of FIG. 6 of the '551 patent, may be used for subsequent communication.*

*When more than one commander station is coupled to a common medium, it is possible for one commander station to thwart the objective of a second commander station. For example, when commander station 10 is attempting to identify all responder stations and commander station 34 issues an 10CG command, commander station 10 may subsequently incorrectly conclude that all responder stations have been identified. Several methods of preventing this incorrect conclusion are available to those skilled in communication and computer programming arts. Exemplary methods include enabling a commander station to monitor commands issued by another commander station to avoid inappropriate conclusions; enabling a commander station 10 to record the TAG fields sent in messages to another commander station and communicate directly with each such responder station, perhaps prior to and so simplifying, the task of identifying all responder stations; modifying the communication protocol used among commander stations; and causing a second commander station to delay its own attempt to identify all responder stations until after a time sufficient for a first commander station to identify all responder stations. The latter suggestion is practical using the media access control scheme of the present invention as described in the '551 patent. It is practical because the time required to identify a worst-case population of responder stations can be predetermined.*

*The present invention as described in the '551 patent can be implemented in several alternate embodiments. As already discussed, various alternatives are available for common medium 32 including all media that support forms of electromagnetic energy, all sound, vibration, and pressure wave conducting media, and all media capable of transporting variation in chemical concentration, to name a few. If a medium other than radio communication is selected as an embodiment of the present invention as described in the '551*

*patent, variations in network interface 26 and 60 can be made by those skilled in the arts that apply to the selected medium. Appropriate signal sensors and generators are well known in applications including measurement and control apparatus. Packet synchronization techniques, packet formats, error detection techniques, and error correction techniques may vary or be omitted as a matter of design choice depending on the need for receiver synchronization, the signal to noise properties of the selected media, and the desired simplicity of network interfaces.*

*Another group of alternative embodiments uses various means to specify a set of responder station identities or designations. The embodiments described above employ an ARBITRATION NUMBER selected from a predetermined range of numbers and expressed as part of a message. For example, alternate sets of designations include a set of operating modes, a set of modulation techniques, and a range of values used to shift in time all or a portion of a command. Various alternatives are also available for specifying (i.e. addressing) a subset of designations. The branch/mask, high/low, and limit/bound subset addressing techniques can each be applied to one or more parametric quantities related to the above mentioned set designations. For example, if onemember of the set is characterized by a bandwidth, a channel frequencies, a phase variation, or a duration in time, then a range of each of these parameters could be described by a branch/mask pair of values.*

*Various alternatives for transmitting the command signal are within the scope of the present invention as described in the '551 patent. In the embodiments described at length above, the BRANCH and MASK values in the message format characterize the transmitted command signal according to a subset of responder stations to which the command is directed. In addition to the variations in modulation already described, the transmitted signal can be characterized by variation in the spread spectrum chip sequence or initial code within a chip sequence when spread spectrum transmission is employed.*

*Other characteristics of a command signal can be used to limit or expand the subset of responder stations to which the command is directed. For example, the operation of commands including RO and WR to set locked-bit 88 and the operation of commands including IDG and IDCG to conditionally clear locked-bit 88 show how the command opcode can be used to characterize a command signal according to a selected subset or address range. Alternatively, modulation variations, timing variations, or other message content variations could also be used to set or clear an equivalent of the locked-bit function.*

*Various means are suitable for use by a responder station to determine whether it is addressed by, i.e. whether it is a member of the subset indicated by, a command signal. Several arithmetic comparison techniques based on message content have been described above. Other means, based on whether the signal received by the responder is received without error, are appropriate when variations in modulation are used to address a subset of responder stations. For example, received signal strength below a threshold over one or more frequencies or at a particular time could cause commands to be received or rejected. Similarly, operation of functions similar to locked-bit 88 as already described and variation in spread spectrum chip sequence could be used to cause commands to be received or rejected.*

*Within the scope of the present invention as described in the '551 patent, each responder station includes means for establishing a self designation. In the embodiments discussed at length above, the self designation is determined by a random number generator, held in a register, and included in a response packet. Alternative techniques include various means for sampling a random process to acquire an analog parametric value and using either a digital or an analog value to control the functions of network interface 60.*

*Network interface 60 can be constructed and operated in several alternative embodiments to transmit a response packet in a way characterized by the responder station self designation. All of the following variations could be used in embodiments that fall within the scope of the present invention as described in the '551 patent: variations in the modulation technique, including variation within a range of values used to shift in time all or a portion of a response; variation in the spread spectrum chip sequence or initial code within a chip sequence when spread spectrum transmission is employed; variation in message content including preamble, postamble, response type indicator e.g. IDR, RDR, and WDR, register contents, status and locked-bit information; and variation based on signal rejection including variation in bandwidth, channel frequencies, signal phase variations, signal duration, or variation in the redundancies used to detect or correct transmission error.*

*Another group of alternative embodiments uses alternative means for selecting a subgroup in response to collision detection. The tree search method that was described as part of the commander station protocol can be implemented in various ways depending on the selected representation of the tree in commander station memory 18. Binary trees have been described above. Other tree structures including n-ary trees could be employed to perform the commander station identification function in an equivalent manner. Depending on the type of tree selected for representation, the use of strings, arrays, stacks, pointers, linked lists, or derivative memory organizations are feasible and equivalent. Finally, tree search methods include depth first, breadth first, and combinations of both depth and breadth searching.*

*Each computer used as part of commander station 10 and as part of responder station 40 includes hardware and software designed to conduct the protocol shown and described in S. 10 and 11 respectively of the '551 patent. Variations in the extent and complexity of hardware and software are well known by designers of ordinary skill in communication and computer arts. Equivalent hardware can include the general purpose computer such as an IBM PC; a calculator, such as an HP21C; the special purpose computer, such as application specific automated controllers used in weighing systems; the microprocessor based system, such as a circuit using an Intel 8048; the microsequencer based system using programmable devices and logic devices; and the integrated circuit or chip set, such as developed from a cell library using semiconductor device design techniques. Variations in the extent and complexity of software compatible with one or more of the above mentioned hardware variations are also well known by the programmer of ordinary skill.*

*The systems designer of ordinary skill chooses to implement each control function in either hardware or software or a combination of both. A computer is said to conclude a certain result when it has determined the state of a control function. When a control function is implemented using a computer system, variations in the form of the result of the control function are well known. For example, a parameter that results from a first control function and is relied upon by a second control function can take the form of a signal when the second control function is in part hardware or the form of a pointer, value, or symbol stored in a register or memory when the second control function is in part software.*

*The present invention as described in the '551 patent has been described in the preferred embodiment. Several variations and modifications have also been described and suggested. Other embodiments, variations, and modifications known to those skilled in the art may be implemented without departing from the scope and spirit of the invention as recited in the claims below.*

What is claimed is:

[1. A method of testing the RF communication operation of an RF transponder, comprising the steps of:

providing a sheet characterized by first and second opposite faces and a thickness;

mounting on the sheet an RF transponder that includes a transponder RF antenna;

positioning a first RF shield so as to abut the first face of the sheet;

positioning a second RF shield so as to abut the second face of the sheet, the second RF shield being in the shape of a cup having a mouth abutting said second face, wherein the first and second RF shields are positioned so that the first and second RF shields together form a closed cavity which completely surrounds and encloses the transponder RF antenna except where the thickness of the sheet separates the first RF shield from the mouth of the second RF shield, wherein said thickness is sufficiently small so that the first and second RF shields prevent any RF signals within the cavity from radiating outside the cavity;

positioning a test fixture RF antenna within the cavity;

transmitting an RF signal from the test fixture antenna;

detecting a response by the transponder to the RF signal; and subsequently removing the transponder from proximity to the first and second shields and the test fixture RF antenna, so that no shielding obstructs the transponder RF antenna from sending and receiving RF radiation at any angle.]

[2. A method according to claim 1, wherein the cavity encloses the entire RF transponder.]

[3. A method according to claim 1, wherein the sheet has no shielding mounted thereon that obstructs RF radiation from the transponder RF antenna.]

[4. A method according to claim 1, wherein:

the first RF shield is in the shape of a cup having a mouth abutting the first face; and the step of positioning the second RF shield further comprises aligning the mouth of the second shield with the mouth of the first shield.]

[5. A method according to claim 1, wherein the step of positioning the test fixture RF antenna within the cavity comprises:

mounting the test fixture RF antenna to a surface of one of the two RF shields;

connecting an RF transmission line to the test fixture RF antenna; and passing the transmission line through an opening in said one RF shield to extend outside the cavity.]

[6. A method according to claim 1, further comprising the step of:

fabricating the sheet to include electrically conductive material adjacent the mouth of the second RF shield so as to improve RF shielding of the cavity.]

[7. A method according to claim 1, wherein the RF signal is transmitted at a predetermined wavelength, and wherein the RF shields are dimensioned to improve the gain of the cavity at that wavelength.]

[8. A method according to claim 1, wherein the RF signal is transmitted at a predetermined wavelength, and wherein the RF shields are dimensioned so that the cavity resonates at that wavelength.]

[9. A method of testing the RF communication operation of a plurality of RF transponders, comprising the steps of:

providing a sheet characterized by first and second opposite faces and a thickness;

mounting on the sheet a plurality of RF transponders, wherein each transponder includes a transponder RF antenna;

positioning a first test fixture section having a first RF shield so that the first RF shield abuts the first face of the sheet;

positioning a second test fixture section so as to abut the second face of the sheet, wherein:

the second test fixture section includes a plurality of RF shields, each RF shield in the second test fixture section is in the shape of a cup having a mouth abutting said second face of the sheet, the first and second test fixture sections so that each RF shield in the second test fixture section encircles a corresponding one of the transponder RF antennas so as to form, in combination with the first RF shield, a closed cavity that completely surrounds and encloses said corresponding transponder RF antenna except where the thickness of the sheet separates the first RF shield from the mouth of said RF shield in the second test fixture section, and said thickness is sufficiently small so that the first and second RF shields prevent any RF signals within the cavity from radiating outside the cavity;

positioning within each cavity a corresponding test fixture RF antenna;

transmitting an RF signal from each test fixture antenna;

detecting a response by each transponder to the RF signal transmitted by its corresponding test fixture antenna; and subsequently removing each transponder from proximity to the first and second test fixture sections and the test fixture RF antennas, so that no shielding obstructs each transponder RF antenna from sending and receiving RF radiation at any angle.]

[10. A method according to claim 9, wherein the each cavity encloses the entire corresponding RF transponder.]

[11. A method according to claim 9, wherein:

the first RF shield is in the shape of a plurality of cups so that each cup has a mouth abutting the first face of the sheet; and the step of positioning the second RF shield further comprises aligning each mouth of the second shield with a corresponding mouth of the first shield.]

[12. A test fixture for testing the RF communication operation of an RF transponder which is mounted on a sheet which extends beyond the perimeter of the transponder, the RF transponder having an antenna for receiving RF signals, comprising:

first and second RF shields, the second RF shield being in the shape of a cup having a mouth;

an alignment mechanism for positioning the first and second RF shields to abut opposite sides of the sheet so that the mouth encircles the transponder antenna and so that the combination of the first and second RF shields forms a closed cavity completely surrounding and enclosing the transponder antenna except where the sheet separates the two RF shields, wherein the distance by which the sheet separates the two RF shields is small enough to prevent any RF signals within the cavity from radiating outside the cavity; and a test fixture RF antenna mounted within the cavity.]

[13. A test fixture according to claim 12, further comprising:

a test fixture RF transmitter having an output connected to the test fixture RF antenna so that the RF antenna radiates RF signals to the transponder RF antenna; and a test fixture RF receiver having an input connected to the test fixture RF antenna so that the RF receiver receives any responses transmitted by the RF transponder in response to said RF signals.]

[14. A test fixture according to claim 12, wherein the cavity encloses the entire transponder.]

[15. A test fixture according to claim 12, wherein:

the first RF shield is in the shape of a cup having a mouth abutting the first face; and the alignment mechanism aligns the mouth of the second shield with the mouth of the first shield.]

[16. A method according to claim 12, further comprising:

an RF transmission line connected to the test fixture RF antenna;

wherein the transmission line extends through an opening in one of the RF shields so as to extend outside the cavity.]

[17. A test fixture according to claim 12, further comprising a test fixture RF transmitter for providing to the transponder antenna RF test signals having a predetermined wavelength, wherein the first and second RF shields are dimensioned to improve the gain of the cavity at that wavelength.]

[18. A test fixture according to claim 12, further comprising a test fixture RF transmitter for providing to the transponder antenna RF test signals having a predetermined wavelength, wherein the first and second RF shields are dimensioned so that the cavity resonates at that wavelength.]

[19. A test fixture for testing the RF communication operation of a plurality of RF transponders mounted on a sheet, each RF transponder having an RF antenna, comprising:

a first test fixture section including a first RF shield;

a second test fixture section including a plurality of RF shields each of which is in the shape of a cup having a mouth;

an alignment mechanism for positioning the first and second test fixture sections to abut opposite sides of the sheet so that each RF shield in the second test fixture section encircles a corresponding one of the transponder antennas so as to form, in combination with the first RF shield, a closed cavity that completely surrounds and encloses said corresponding transponder RF antenna except where the sheet separates the first RF shield from the mouth of said RF shield in the second test fixture section, wherein the distance by which the sheet separates the first RF shield from each RF shield of the second test fixture section is small enough to prevent any RF signals within each cavity from radiating outside that cavity; and a test fixture RF antenna mounted within each cavity.]

[20. A test fixture according to claim 19, wherein:

the first RF shield is in the shape of a plurality of cups so that each cup has a mouth abutting the sheet; and the alignment mechanism aligns each mouth of the second shield with a corresponding mouth of the first shield.]

*21. An interrogator for performing radio frequency communications, the interrogator comprising:*

*one or more antennas,*

*a transmitter communicatively coupled to the one or more antennas and configured to transmit one or more messages and RE energy to power a radio frequency identification (RFID) tag:*

*a receiver communicatively coupled to the one or more antennas and configured to receive one or more responses;*

*a processing unit communicatively coupled to the transmitter to transmit a first command to set an inventory flag on the RFID tag to a first state and to transmit a second command to set the inventory flag on the RFID tag to second state, the RFID tag being identified by one or more random numbers received by the processing unit via the receiver and the one or more antennas.*

*22. The interrogator of claim 21, wherein the processing unit is further configured to cause the transmitter to transmit at a radio frequency in accordance with a frequency-hopping algorithm.*

*23. The interrogator of claim 21, wherein the first command and the second command includes the same random number generated by the RFID tag.*

*24. A method of performing radio frequency communications, the method comprising:*

*generating by a radio frequency identification (RFID) tag a random number, the random number having a plurality of bits:*

*determining by an interrogator a first radio frequency band to transmit messages to the RFID tag*

*transmitting by the interrogator a first command at the first radio frequency band; transmitting by the interrogator RF enemy to power the RFID tag; receiving by the RFID tag the first command at the first radio frequency band:*

*setting an inventoried flag in the RFID tag to a first state, the setting being performed in response to the receiving the first command*

*communicating by the RFID tag a response to the first command at a second radio frequency band;*

*receiving one or more additional commands from the interrogator on the first radio frequency band; and*

*in response to at least one of the additional commands, setting the inventoried flag in the RFID tag to a second state, wherein the first command, the response, and the one or more additional commands include at least a part of one or more random numbers generated by the RFID tag.*

*25. The method of claim 24, wherein the determining a first radio frequency band comprises:*

*selecting the first radio frequency band in accordance with a frequency-hopping algorithm.*

*26. The method of claim 24, further comprising communicating by the RFID tag data associated with one or more memory locations contained on the RFID tag.*

*27. The method of claim 24, wherein the interrogator identifies the first RFID tag in subsequent communications using at least one random number provided to the interrogator by the RFID tag.*

*28. A system for performing radio frequency communications, the system comprising:*

*one or more antennas;*

*one or more interrogators communicatively coupled to the one or more antennas and configured to transmit a first message and a second message via the one or more antennas; and*

*a radio frequency identification (RFID) tag having a dipole antenna coupled to one or more items to be tracked and configured to set an inventory flag to a first state upon*

*receipt of the first command and to a second state upon receipt of the second command, the first command including at least one random number generated by the RFID tag and the second command including at least one random number generated by the RFID tag.*

*29. The system of claim 28, wherein the interrogator is further configured to select a first radio frequency to transmit at in accordance with a frequency-hopping algorithm.*

* * * * *